(12) United States Patent
Hirasawa et al.

(10) Patent No.: US 9,773,759 B2
(45) Date of Patent: Sep. 26, 2017

(54) ELECTRIC POWER CONVERTER

(71) Applicant: DENSO CORPORATION, Kariya, Aichi-pref. (JP)

(72) Inventors: Naoki Hirasawa, Kariya (JP); Ryota Tanabe, Kariya (JP); Hiromi Ichijo, Kariya (JP); Takashi Kawashima, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/353,009

(22) Filed: Nov. 16, 2016

(65) Prior Publication Data

US 2017/0141082 A1 May 18, 2017

(30) Foreign Application Priority Data

Nov. 17, 2015 (JP) ................... 2015-225041

(51) Int. Cl.
| | |
|---|---|
| *H01L 25/065* | (2006.01) |
| *B60L 11/18* | (2006.01) |
| *H01L 23/053* | (2006.01) |
| *H01L 23/32* | (2006.01) |
| *H01L 23/473* | (2006.01) |
| *H02M 7/00* | (2006.01) |
| *H05K 7/20* | (2006.01) |

(52) U.S. Cl.
CPC ...... *H01L 25/0657* (2013.01); *B60L 11/1874* (2013.01); *H01L 23/053* (2013.01); *H01L 23/32* (2013.01); *H01L 23/473* (2013.01); *H02M 7/003* (2013.01); *H05K 7/20927* (2013.01); *H01L 2225/06555* (2013.01); *H01L 2225/06582* (2013.01); *H01L 2225/06589* (2013.01)

(58) Field of Classification Search
CPC ... H01L 25/06; H01L 25/065; H01L 25/0657; H01L 23/05; H01L 23/053; H01L 23/32; H01L 23/47; H01L 23/473
USPC ......................................... 257/714
See application file for complete search history.

(56) References Cited

U.S. PATENT DOCUMENTS

| | | | |
|---|---|---|---|
| 8,488,734 B2 * | 7/2013 | Ahlfeld .................. | G21C 1/026 376/409 |
| 8,654,527 B2 * | 2/2014 | Wei ......................... | H01L 25/16 257/714 |
| 2013/0058068 A1 | 3/2013 | Funatsu | |

FOREIGN PATENT DOCUMENTS

| | | |
|---|---|---|
| JP | 2010-200478 A | 9/2010 |
| JP | 4867889 B2 | 2/2012 |

(Continued)

*Primary Examiner* — Monica D Harrison
(74) *Attorney, Agent, or Firm* — Oliff PLC

(57) ABSTRACT

An electric power converter includes a semiconductor module, an electronic component, a plurality of cooling tubes, a case, a main pressure member for pressing a stacked semiconductor section in a stacking direction, and a sub-pressure member for pressing a stacked component section in the stacking direction. The stacked semiconductor section and the stacked component section are stacked in line. A pressing force of the main pressure member is greater than a pressure pressing force of the sub-pressure member. The main pressure member is disposed at an end portion of the stacked component section far from the stacked semiconductor section. A supporting portion that supports the stacked semiconductor section from the stacked component section side is disposed in the case so as to prevent the pressing force of the main pressure member from acting on the stacked component section.

10 Claims, 25 Drawing Sheets

(56) References Cited

FOREIGN PATENT DOCUMENTS

| | | |
|---|---|---|
| JP | 2012-222943 A | 11/2012 |
| JP | 2013-085393 A | 5/2013 |
| JP | 2014-103733 A | 6/2014 |
| JP | 2016-005424 A | 1/2016 |

\* cited by examiner

FIG.25
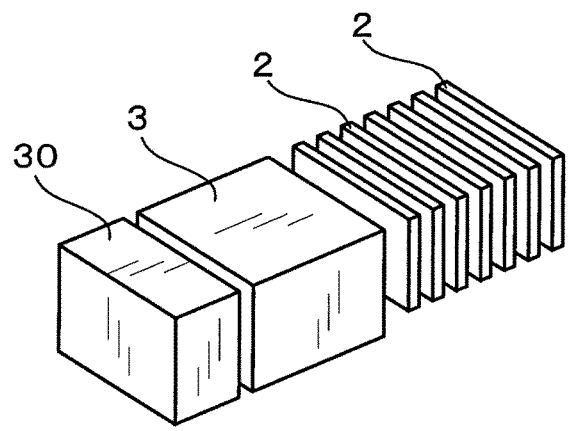
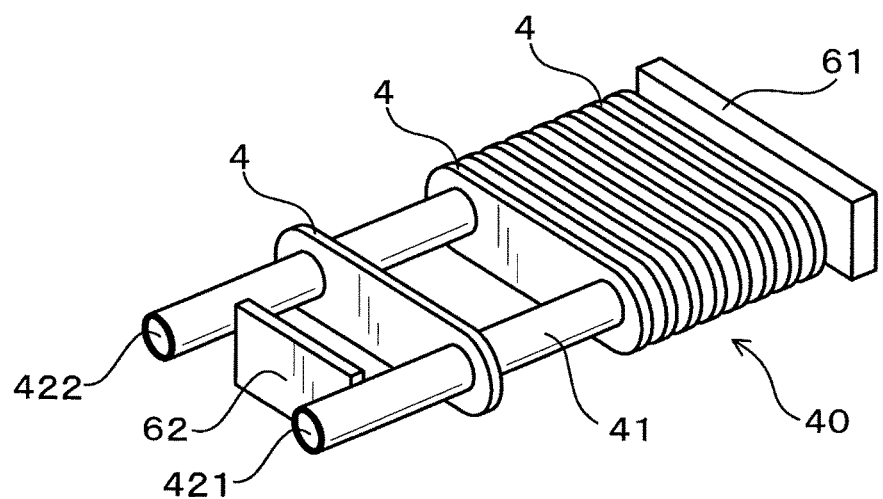
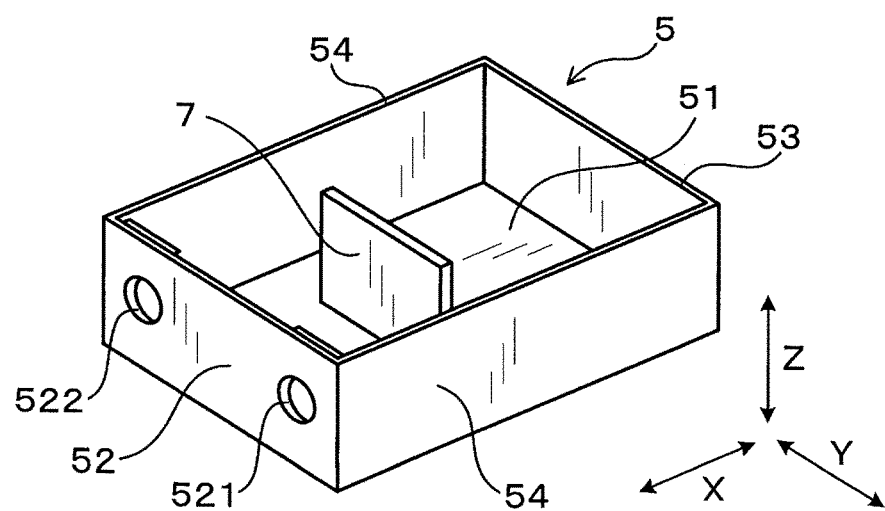

ELECTRIC POWER CONVERTER

CROSS-REFERENCE TO RELATED APPLICATION

This application is based on and claims the benefit of priority from earlier Japanese Patent Application No. 2015-225041 filed Nov. 17, 2015, the description of which is incorporated herein by reference.

TECHNICAL FIELD

The present disclosure relates to an electric power converter having a plurality of cooling tubes for cooling a semiconductor module by sandwiching it from both sides.

BACKGROUND

As an example, there is an electric power converter such as an inverter mounted on an electric vehicle or a hybrid vehicle provided with a plurality of cooling tubes for cooling a semiconductor module by sandwiching it from both sides.

In such an electric power converter, adhesion between the semiconductor module and the cooling tubes is obtained by pressing a stack of the semiconductor module and the cooling tubes in a stacking direction by a pressure member such as a leaf spring.

Further, a structure of stacking a semiconductor module and a reactor together with a plurality of cooling tubes is disclosed in Japanese Patent No. 4867889.

Then, an electric power converter having a structure that a stack of the semiconductor module, the reactor and the plurality of cooling tubes are pressed in a stacking direction by a pressure member is disclosed in Japanese Patent No. 4867889.

However, the following problems exist in the electric power converter of the above-described structure.

That is, according to the pressure structure of the above, a pressing force acting on the reactor and a pressing force acting on the semiconductor module becomes equivalent.

However, cooling of the reactor is not required as a cooling of the semiconductor module.

Therefore, it is preferable to reduce a contact pressure between the reactor and the cooling tubes compared with a contact pressure between the semiconductor module and the cooling tubes.

This is because, if the pressing force acting on the reactor is larger than necessary, a withstand load required for the reactor becomes large, and there is a risk that the reactor becomes large and heavy.

As a result, it can be a factor that inhibits miniaturization and weight reduction of an electric power converter.

Further, when the pressing force acting on the reactor is too large, there is also a risk that it becomes difficult to absorb a thermal expansion and contraction of the reactor by the pressure member.

On the other hand, from a viewpoint of suppressing the temperature of the semiconductor module from increasing, a pressing force of a prescribed level or higher acting on the semiconductor module is required.

Not only limited to the reactor, but a problem similar to the above may occur to other electronic components such as a capacitor, or a DC-DC converter, for example, when a structure of the semiconductor module and the cooling tubes being stacked and pressed together is employed.

SUMMARY

An embodiment provides an electric power converter that can sufficiently obtain a contact pressure between a semiconductor module and a cooling tube, and can control pressing force acting on electronic components electrically connected to the semiconductor module.

In an electric power converter according to a first aspect, the electric power converter includes a semiconductor module with a built-in switching element, an electronic component electrically connected to the semiconductor module, a plurality of cooling tubes for cooling the semiconductor module and the electronic component by sandwiching them from both sides, a case for accommodating the semiconductor module, the electronic component, and the cooling tubes, a main pressure member for pressing a stacked semiconductor section formed by stacking the semiconductor module and the cooling tubes in a stacking direction, and a sub-pressure member for pressing a stacked component section formed by stacking the electronic component and the cooling tubes in the stacking direction.

The stacked semiconductor section and the stacked component section are stacked in line, a pressing force of the main pressure member is greater than a pressing force of the sub-pressure member, the main pressure member is disposed at an end portion of the stacked semiconductor section far from the stacked component section, and a supporting portion that supports the stacked semiconductor section from the stacked component section side is disposed in the case so as to prevent the pressing force of the main pressure member from acting on the stacked component section.

In the electric power converter, the supporting portion is disposed in the case.

The supporting portion supports the stacked semiconductor section from the stacked component section side so as to prevent the pressing force of the main pressure member from acting on the stacked component section.

Therefore, it is possible to prevent the pressing force of the main pressure member that presses the stacked semiconductor section from acting on the electronic component in the stacked component section.

Thus, it is possible to control the pressing force acting on the electronic component.

On the other hand, the pressing force of the main pressure member acts on the stacked semiconductor section, thus a sufficient contact pressure between the semiconductor module and the cooling tube can be obtained.

Therefore, it is possible to obtain a sufficient cooling efficiency of the semiconductor module.

Then, the electric power converter has the sub-pressure member.

Thereby, the pressing force of the sub-pressure member acts on the stacked component section.

Therefore, the cooling tube can be pressed against the reactor in the component stack section at the appropriate contact pressure.

As a result, the cooling of the electronic component can be appropriately performed without increasing the size of the electronic component.

As described above, according to the above aspect, an electric power converter that can sufficiently obtain a contact pressure between a semiconductor module and a cooling tube, and can control pressing force acting on electronic components electrically connected to the semiconductor module can be provided.

BRIEF DESCRIPTION OF THE DRAWINGS

In the accompanying drawings:

FIG. 25 shows an exploded perspective view of the electric power converter according to the tenth embodiment.

DETAILED DESCRIPTION OF THE PREFERRED EMBODIMENTS

First Embodiment

An embodiment of an electric power converter will be described with reference to FIGS. 1 to 5.

Figure 1:
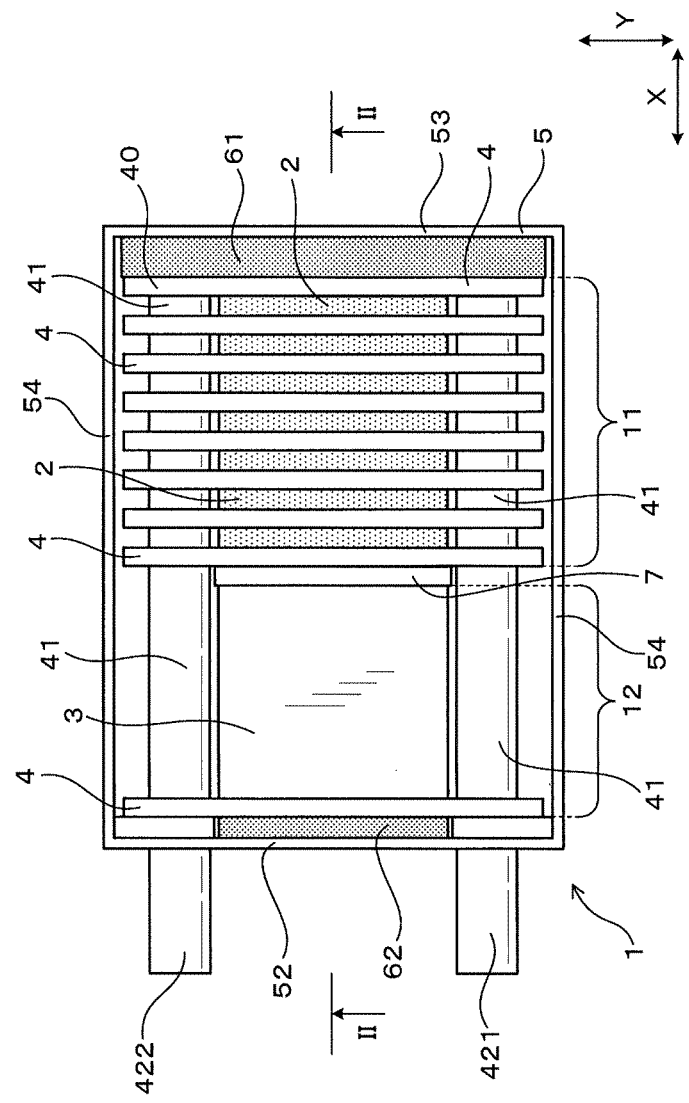
FIG. 1 shows a plan view of an electric power converter according to a first embodiment.
Figure 2:
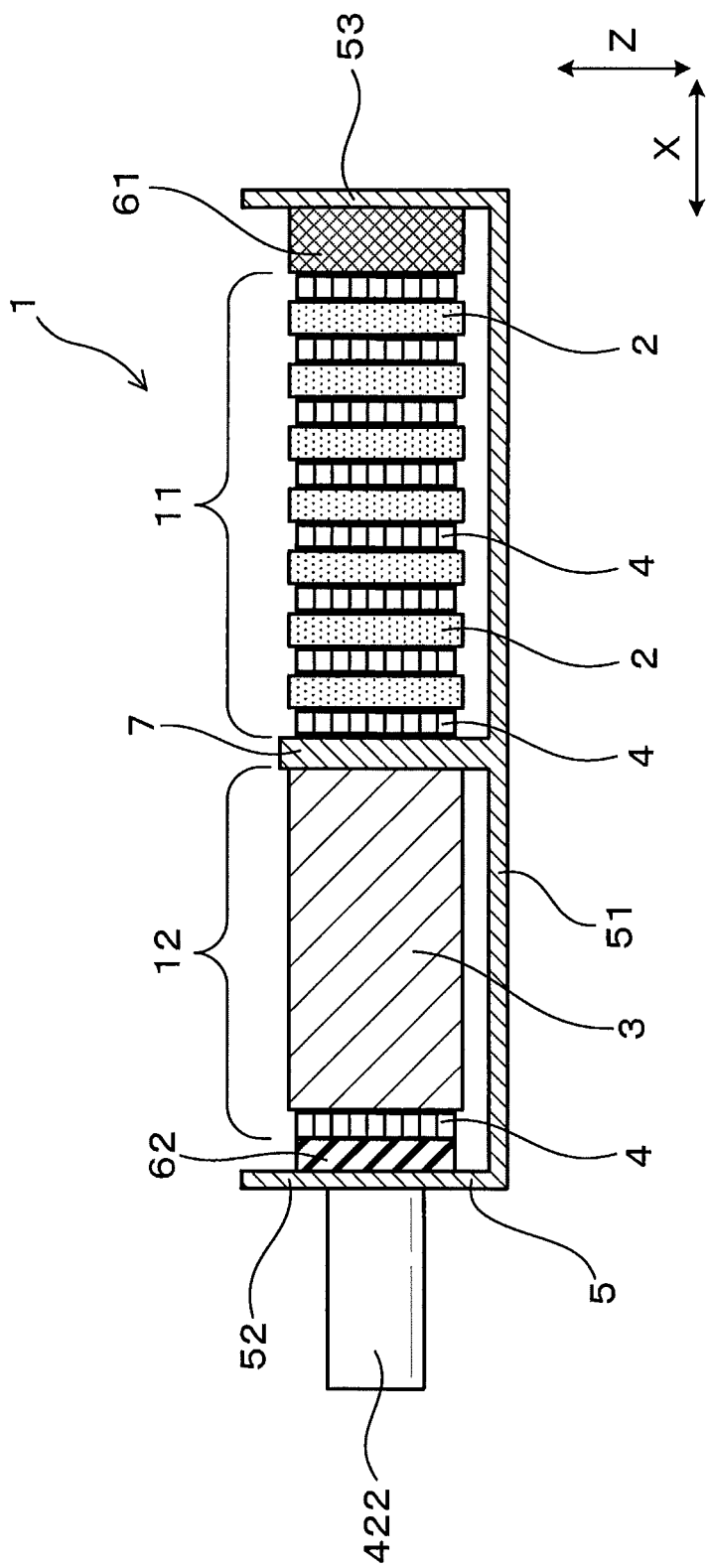
FIG. 2 shows a sectional view taken along a line II-II of FIG. 1.
Figure 3:
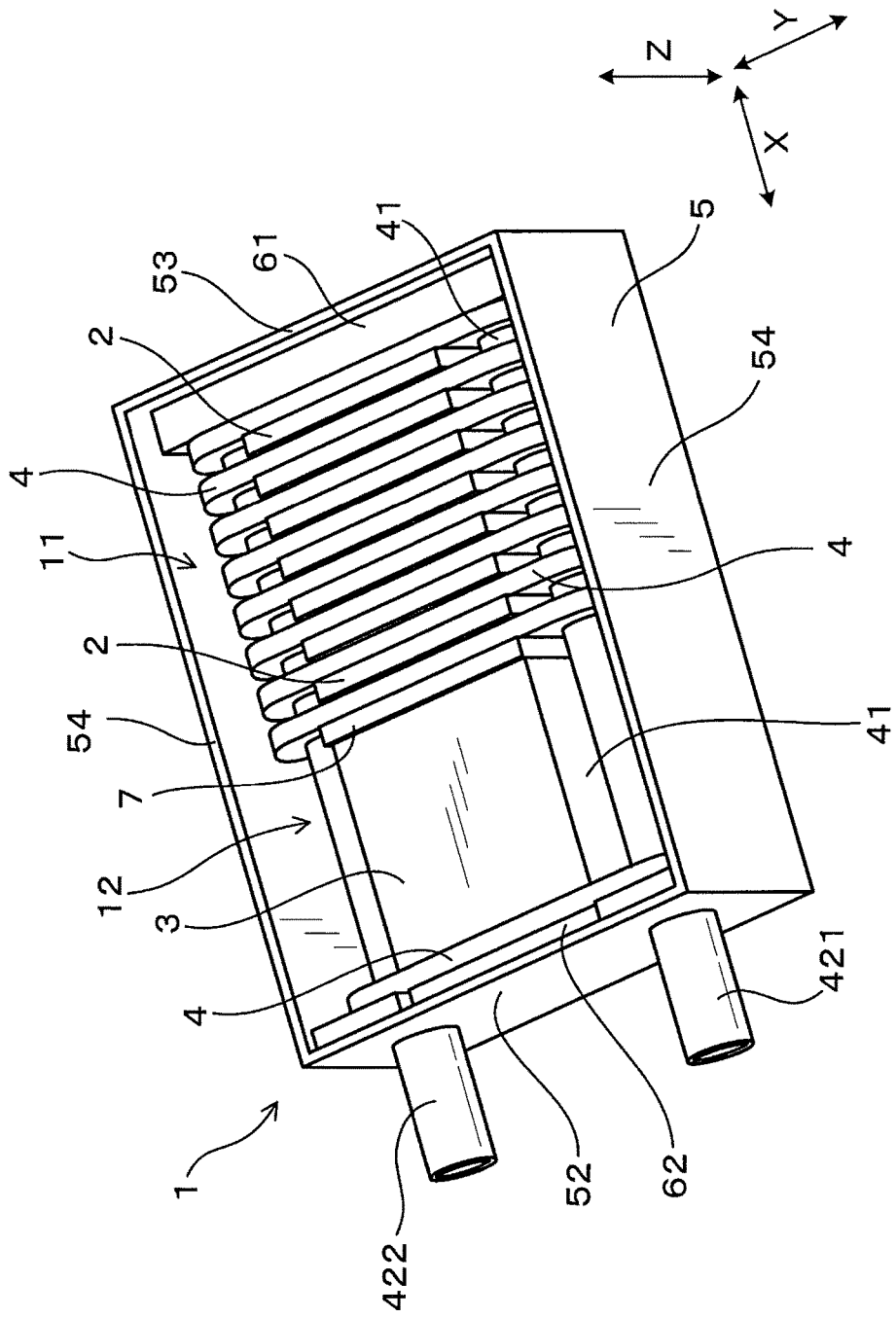
FIG. 3, a perspective view of the electric power converter according to the first embodiment.

As shown in FIGS. 1 to 3, an electric power converter includes semiconductor modules 2, a reactor 3 as an electronic component, a plurality of cooling tubes 4, a case 5, a main pressure member 61, and a sub-pressure member 62.

Each of the semiconductor modules 2 is formed by a built-in switching element.

The reactor 3 is the electronic component electrically connected to the semiconductor modules 2.

The plurality of cooling tubes 4 cools the semiconductor module 2 and reactor 3 by sandwiching them from both sides.

The case 5 accommodates the semiconductor modules 2, reactor 3, and the cooling tubes 4 therein.

The semiconductor modules 2 and the cooling tubes 3 are stacked to form a stacked semiconductor section 11, and the main pressure member 61 presses the stacked semiconductor section 11 in a stacking direction X.

The reactor 3 and the cooling tubes 4 are stacked to form a stacked component section 12, and the sub-pressure member 62 presses the stacked component section 12 in the stacking direction X.

The stacked semiconductor section 11 and the stacked component section 12 are stacked in line.

A pressing force of the main pressure member 61 is greater than a pressing force of the sub-pressure member 62.

The main pressure member 61 is disposed at an end portion of the stacked semiconductor section 11 far from the stacked component section 12.

A supporting portion 7 that supports the stacked semiconductor section 11 from the stacked component section 12 side is disposed in the case 5.

Thus, the electric power converter 1 is configured so as to prevent the pressing force of the main pressure member 61 from acting on the stacked component section 12.

The electric power converter 1 of the present embodiment may be used as an inverter mounted on an electric vehicle or a hybrid vehicle, for example.

As shown in FIGS. 1 to 3 and FIG. 5, the plurality of cooling tubes 4 is disposed side by side in the stacking direction X in a state of being arranged parallel to each other.

The cooling tubes 4 are configured so as a refrigerant to flow therein.

Each of the cooling tubes 4 is disposed so that a longitudinal direction thereof, which is also a flowing direction of the refrigerant, crosses at right angle with the stacking direction X.

The longitudinal direction of the cooling tube 4 is referred to as a lateral direction Y.

The cooling tubes 4 adjacent in the stacking direction X are connected by connecting tubes 41 in vicinities of both end portions in the lateral direction Y.

It should be noted that the connecting tube 41 may be constituted by a part that is formed unitarily with the cooling tube 4, or may be formed by separate members from the cooling tube 4.

In addition, a refrigerant introducing pipe 421 and a refrigerant discharge pipe 422 are disposed projecting in the stacking direction X on a cooling tube 4 positioned at one end in the stacking direction X among the plurality of cooling tubes 4.

In the electric power converter 1 of the present embodiment, a side where the refrigerant introducing pipe 421 and the refrigerant discharge pipe 422 are disposed is referred to as a front side, and a side opposite to the front side is referred to as a rear side.

Further, a direction orthogonal to the stacking direction X and the lateral direction Y is referred to as an upward/downward direction Z.

However, representations of front, rear, up, and low are for convenience, and a disposition and orientation of the electric power converter 1 is not intended to particularly be limited thereto.

A cooler 40 is configured by the plurality of cooling tubes 4, a plurality of connecting tubes 41, the refrigerant introducing pipe 421, and the refrigerant discharge pipe 422 disposed and assembled together as described above.

Then, each semiconductor module 2 and the reactor 3 are disposed between the cooling tubes 4 adjacent in the stacking direction X.

The reactor 3 is sandwiched between the cooling tube 4 at the front end and a cooling tube 4 second from the front end in the stacking direction X.

However, as shown in FIGS. 1 to 3, the supporting portion 7 is interposed between the second cooling tube 4 from the front end and the reactor 3 in the present embodiment.

The stacked component section 12 is configured by the cooling tube 4 at the front end and the reactor 3.

Further, the plurality of cooling tubes 4 other than the cooling tube 4 at the front end and the plurality of semiconductor modules 2 are stacked alternately in the stacking direction X.

Thereby, the stacked semiconductor section 11 is constituted.

The plurality of cooling tubes 4 in the stacked semiconductor section 11 are disposed in a state of being at substantially equal intervals in the stacking direction X.

On the other hand, a space between the cooling tube 4 at the front end and the cooling tube 4 second from the front end is greater than the disposition intervals of the plurality of the cooling tubes 4 in the stacked semiconductor section 11.

Accordingly, connecting tubes 41 of the front end are longer in the stacking direction X than the other connecting tubes 41 in the rear.

The semiconductor modules 2 and the reactor 3 are configured to be cooled by the refrigerant flowing through the cooling tubes 4.

That is, the refrigerant introduced into the cooler 40 from the refrigerant introducing pipe 421 flows by being distributed in a plurality of cooling tubes 4 via suitable connecting tubes 41.

During this period, the refrigerant heat-exchanges with the semiconductor modules 2 or the reactor 3.

The refrigerant that has received heat is discharged from the cooler 40 via the connecting tubes 41 and the refrigerant discharge pipe 422.

In this manner, the semiconductor modules 2 and the reactor 3 are cooled.

Further, the cooler 40 is configured to be deformed so as to decrease the spaces between the adjacent cooling tubes 4 in the stacking direction X by the pressing force in the stacking direction X.

For example, it is possible to compressively deform the connecting tubes 41 in the stacking direction X, or to dispose a diaphragm structure in joints between the connecting tubes 41 and the cooling tubes 4.

The cooling tubes 4 are made of a metal excellent in thermal conductivity such as aluminum.

In addition, the connecting tubes 41, the refrigerant introducing pipe 421, and the refrigerant discharge pipe 422 constituting the cooler 40 are also constituted by a similar metal as the cooling tubes 4.

Further, the case 5 may be made of a metal such as aluminum, for example.

Figure 4:
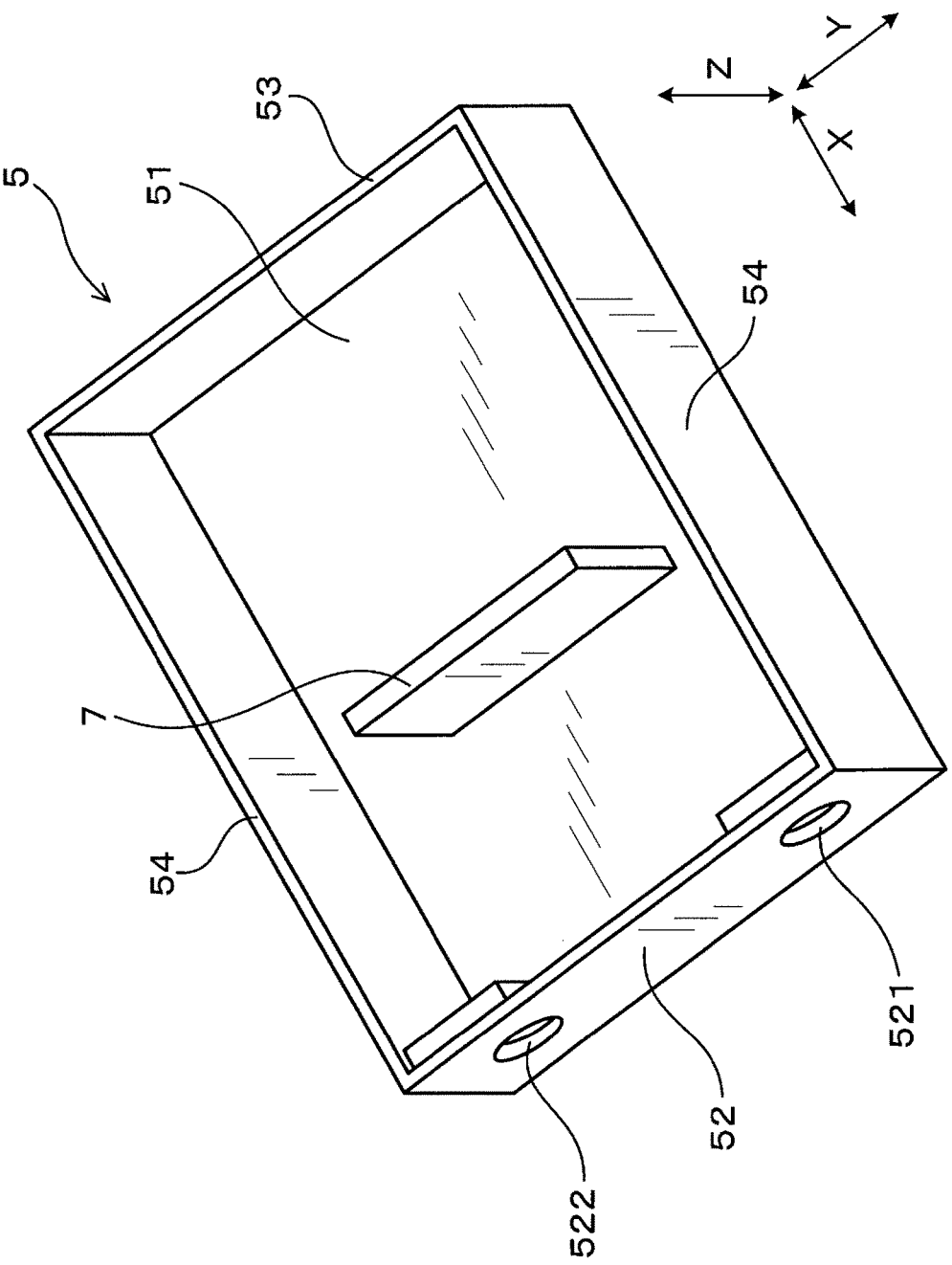
FIG. 4 shows a perspective view of a case according to the first embodiment.

As shown in FIG. 4, the case 5 has a substantially rectangular parallelepiped shape, and may be a shape having an opening in either one of the upward/downward direction Z.

The direction of the case 5 that is opened is conveniently referred to as upward, and the opposite side is referred to as downward.

Then, the case 5 includes a bottom plate portion 51 having a normal direction of the upward/downward direction Z, a front wall portion 52 disposed upwardly from a front end of the bottom plate portion 51, a rear wall portion 53 disposed upwardly from a rear end of the bottom plate portion 51, and a pair of side wall portions 54 disposed upwardly from side edges of the bottom plate portion 51.

Through holes 521, 522 through which the refrigerant introducing pipe 421 and the refrigerant discharge pipe 422 are penetrated, respectively, are formed in the front wall portion 52.

Further, in the present embodiment, as shown in FIGS. 2 and 4, the supporting portion 7 is formed protruding upwardly from a predetermined position on the bottom plate portion 51.

The supporting portion 7 is formed unitarily with the case 5.

As shown in FIGS. 1 to 3, the front wall portion 52 is opposed with respect to the stacked component section 12 from the front.

The rear wall portion 53 is opposed with respect to the stacked semiconductor section 11 from the rear.

The refrigerant introducing pipe 421 and the refrigerant discharge pipe 422 respectively penetrate the through holes 521, 522 formed on the front wall portion 52, and protrude to the front.

Then, the main pressure member 61 is interposed between the rear wall portion 53 and the stacked semiconductor section 11.

Thereby, the stacked semiconductor section 11 interposed between the main pressure member 61 and the supporting portion 7 is compressively pressed in the stacking direction X.

On the other hand, the sub-pressure member 62 is disposed at an end portion of the stacked component section 12 far from the stacked semiconductor section 11.

More specifically, the sub-pressure member 62 is interposed between the front wall portion 52 and the stacked component section 12.

Thereby, the reactor 3 and the cooling tubes 4 disposed at the front side of the reactor 3 are in a state of being sandwiched between the sub-pressure member 62 and the supporting portion 7.

Therefore, the pressing force of the sub-pressure member 62 acts on the cooling tube 4 at the front end and the reactor 3.

Then, the pressing force of the main pressure member 61 is prevented from acting on the reactor 3 by the presence of the supporting portion 7.

Although not shown, the main pressure member 61 may be constituted by a leaf spring, for example.

In particular, the leaf spring may be constituted by bending a spring steel.

In addition, it is also possible to interpose a pressure plate with high rigidity between the leaf spring and the cooling tube 4.

Thereby, it is possible to prevent the cooling tube 4 from deforming by a local pressing force applied from the leaf spring.

Further, the sub-pressure member 62 may be made of an elastic member such as a rubber sheet, for example.

The sub-pressure member 62 is interposed between the front wall portion 52 and the cooling tube 4 in a state of compressively elastic-deformed.

The semiconductor module 2 is formed by molding a switching element composed of IGBT or the like by a resin.

IGBT stands for Insulated Gate Bipolar Transistor.

The semiconductor module 2 may be formed by integrating a plurality of switching element, or may be formed by integrating a diode together with the switching element.

Figure 5:
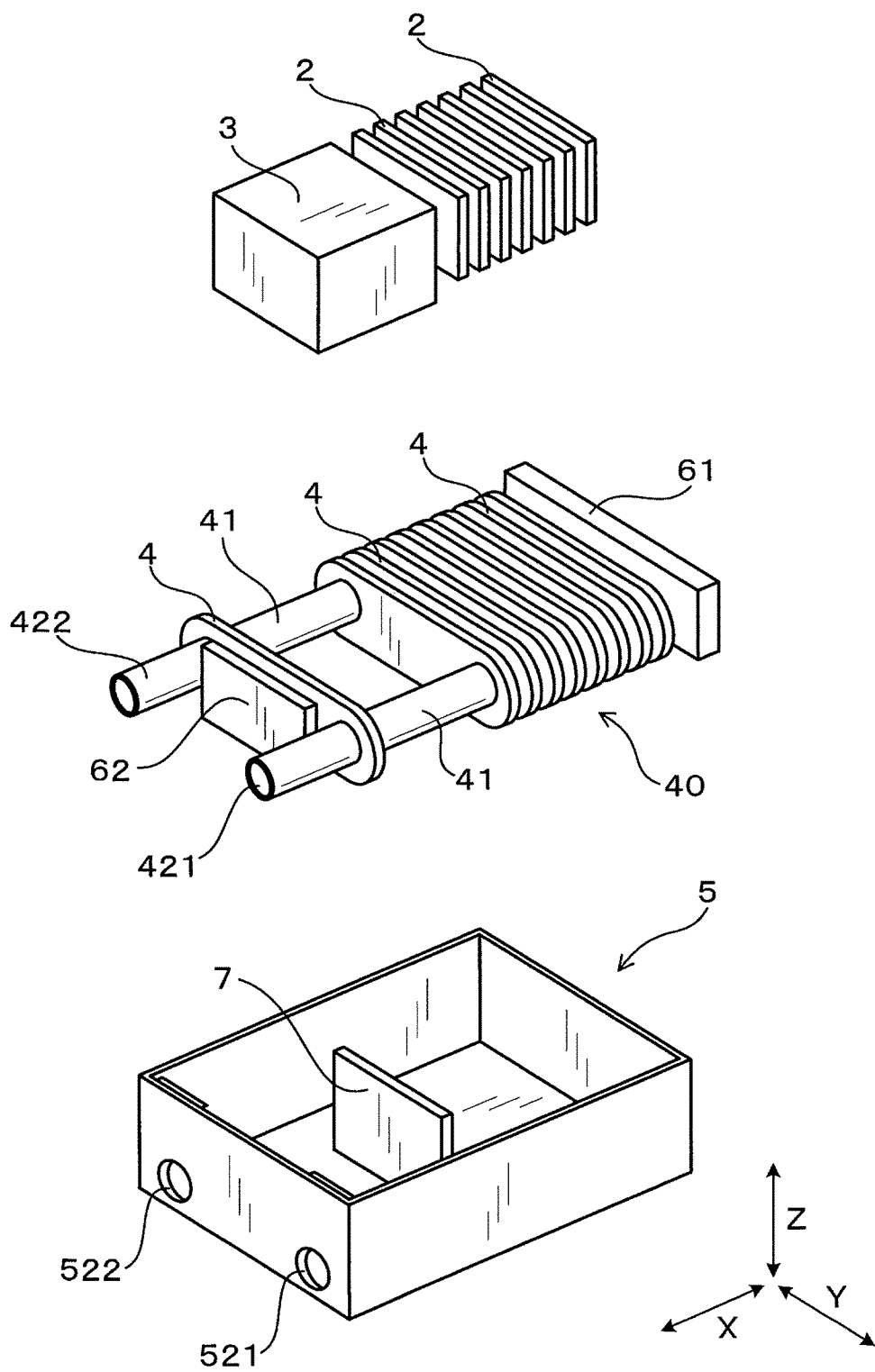
FIG. 5 shows an exploded perspective view of the electric power converter according to the first embodiment.

Further, as shown in FIG. 5, the semiconductor module has a rectangular parallelepiped shape of which the dimension in the stacking direction X is shorter than the dimension in the lateral direction Y and the dimension in the upward/downward direction Z.

Moreover, the semiconductor module 2 is formed by protruding terminals (not shown) from a resin portion in the upward/downward direction Z.

Next, functions and effects of the present embodiment are described.

In the electric power converter 1, the supporting portion 7 is disposed in the case 5.

The supporting portion 7 supports the stacked semiconductor section 11 from the front so as to prevent the pressing force of the main pressure member 61 from acting on the stacked component section 12.

Therefore, it is possible to prevent the pressing force of the main pressure member 61 that presses the stacked semiconductor section 11 from acting on the reactor 3 in the stacked component section 12.

Thus, it is possible to control the pressing force acting on the reactor 3.

On the other hand, the pressing force of the main pressure member 61 is to act on the stacked semiconductor section 11, thus a sufficient contact pressure between the semiconductor module 2 and the cooling tube 4 can be obtained.

Therefore, it is possible to obtain a sufficient cooling efficiency of the semiconductor module 2.

Then, the electric power converter 1 has the sub-pressure member 62.

Thereby, the pressing force of the sub-pressure member 62 acts on the stacked component section 12.

Therefore, the cooling tube 4 can be pressed against the reactor 3 in the component stack section 12 at the appropriate contact pressure.

As a result, the cooling of the reactor 3 can be appropriately performed without increasing the size of the reactor 3.

Further, the thermal expansion and contraction of the reactor 3 can be sufficiently absorbed by the sub-pressure member 62.

The supporting portion 7 is formed unitarily with the case 5.

Therefore, it is possible to reduce the number of components in the electric power converter 1.

Along with this, it is possible to reduce the number of assembling steps of the electric power converter 1.

The sub-pressure member 62 is disposed on a surface of the cooling tube 4 opposite to the reactor 3 side.

Thereby, it is possible to press the cooling tube 4 to the reactor 3.

As a result, it is possible to improve the heat radiation efficiency of the reactor 3.

As described above, according to the present embodiment, while sufficiently obtaining the contact pressure between the semiconductor modules 2 and the cooling tubes 4, it is possible to provide the electric power converter 1 that can suppress the pressing force from acting on the reactor 3.

Second Embodiment

Figure 6:
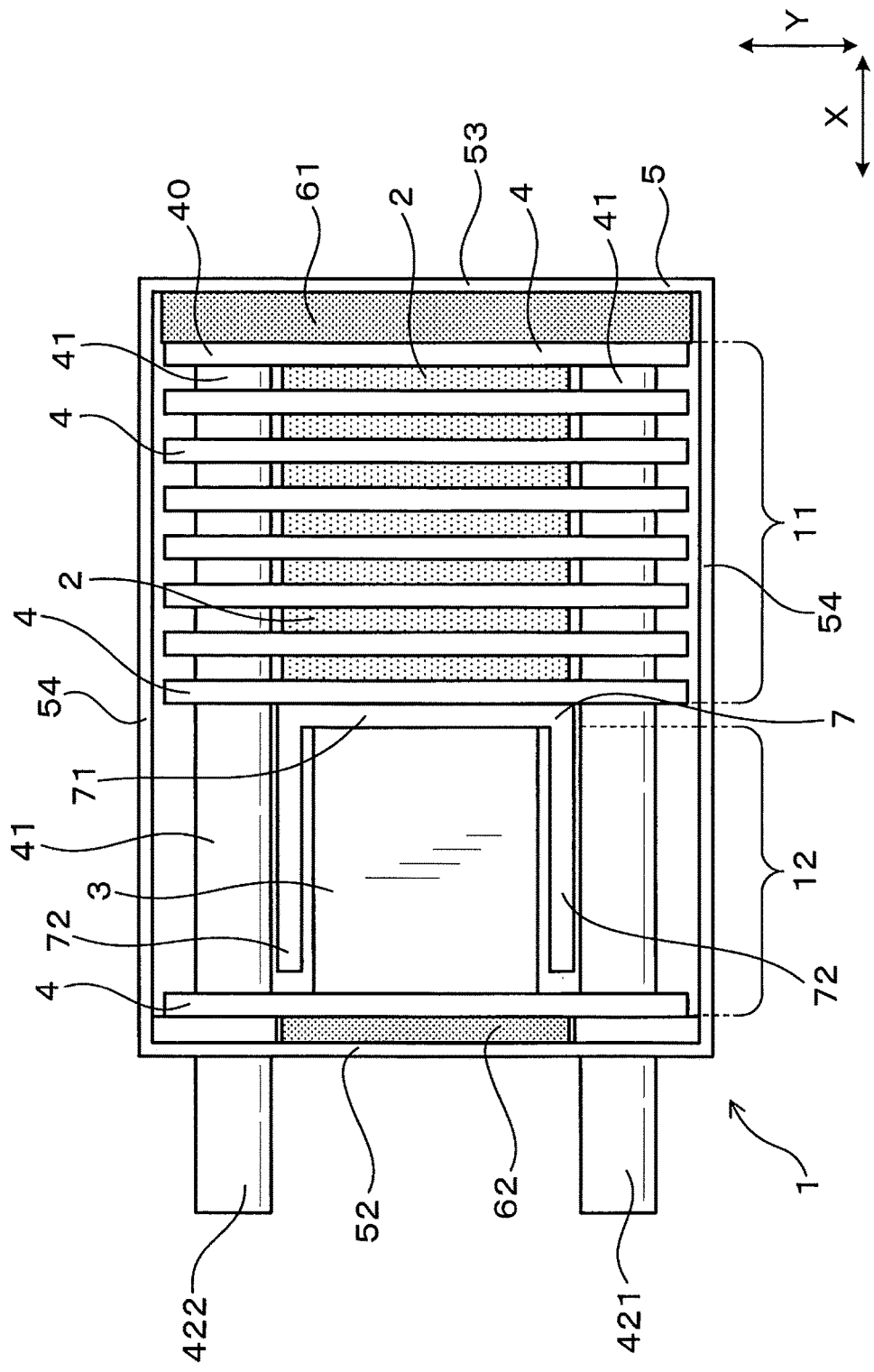
FIG. 6 shows a plan view of an electric power converter according to a second embodiment.
Figure 7:
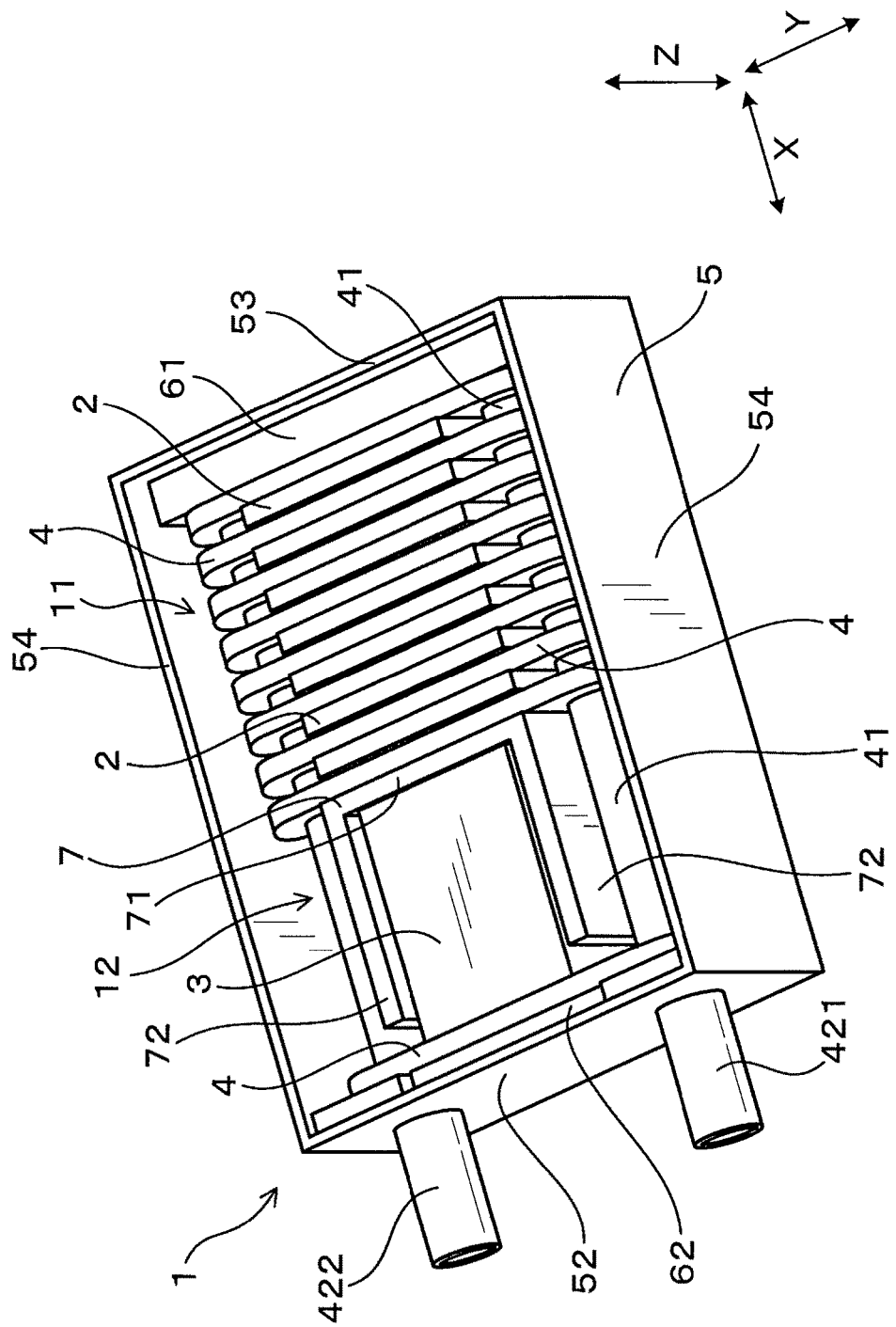
FIG. 7 shows a perspective view of the electric power converter according to the second embodiment.
Figure 8:
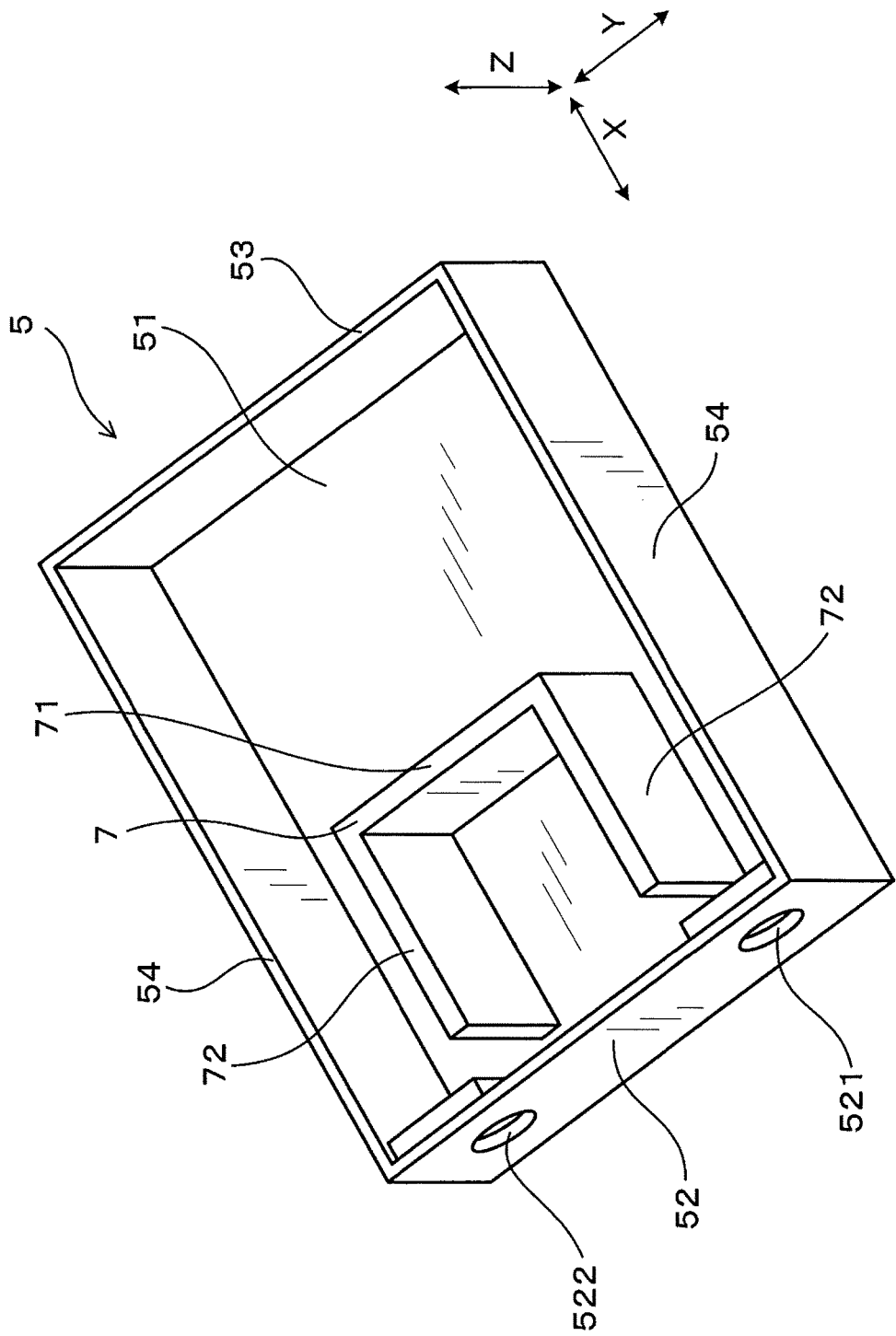
FIG. 8 shows a perspective view of a case according to the second embodiment.

As shown in FIGS. 6 to 8, a shape of a supporting portion 7 of the present embodiment has a different shape from that shown in the first embodiment.

That is, in the present embodiment, the supporting portion 7 includes a main plate portion 71 formed in parallel with the front wall portion 52 and rear wall portion 53, and a pair of vertical plate portions 72 formed in parallel with the side wall portions 54 so as to extend forwardly from both ends of the main plate portion 71.

The main plate portion 71 and the vertical plate portions 72 are unitarily and continuously formed with each other.

In addition, the main plate portion 71 and the vertical plate portions 72 are orthogonal to each other.

As shown in FIG. 8, the main plate portion 71 and the vertical plate portion 72 are disposed upwardly from the bottom plate portion 51, and are unitarily formed with the case 5.

The supporting portion 7 according to the present embodiment has a shape of adding a pair of vertical plate portions 72 in the supporting portion according to the first embodiment.

As shown in FIGS. 6 and 7, the cooling tube 4 at the front end of the stacked semiconductor section 11 is pressed against the main plate portion 71 of the supporting portion 7.

In addition, the reactor 3 of the stacked component section 12 is pressed against the main plate portion 71.

The reactor 3 is disposed inside a space surrounded by the main plate portion 71 and the pair of vertical plate portions 72 constituting the supporting portion 7.

That is, the pair of vertical plate portions 72 are disposed so as to face side surfaces in the lateral direction Y of the reactor 3.

Then, the pair of vertical plate portion 72 are interposed between the reactor 3 and the connecting tubes 41 of the cooler 40.

Further, a gap is disposed between front ends of the pair of vertical plate portions 72 and the cooling tube 4 disposed in the front side of the reactor 3.

Other configurations are the same as those in the first embodiment.

It should be appreciated that, in the second embodiment and the subsequent embodiments, components identical with or similar to those in the first embodiment are given the same reference numerals, unless otherwise indicated, and repeated structures and features thereof will not be described in order to avoid redundant explanation.

In the present embodiment, since the supporting portion 7 has the vertical plate portion 72, it is possible to increase withstand load of the supporting portion 7 in the stacking direction X.

That is, the pressing force by the main pressure member 61 can be more reliably supported by the supporting portion 7.

Apart from that, it has the same functions and effects as the first embodiment.

Third Embodiment

Figure 9:
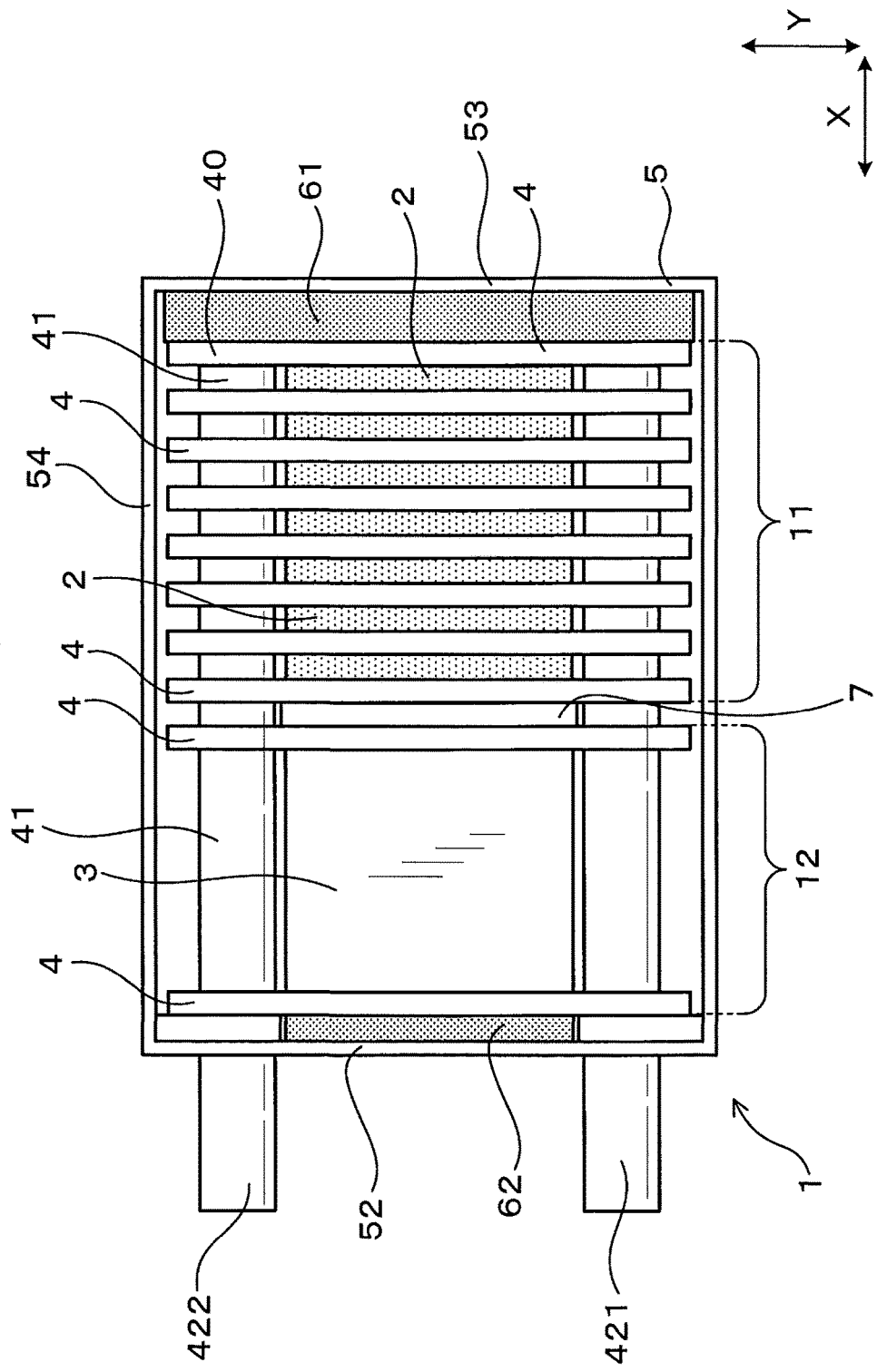
FIG. 9 shows a plan view of an electric power converter according to a third embodiment.

As shown in FIG. 9, the present embodiment is an embodiment in which a supporting portion 7 is interposed between a pair of cooling tubes 4.

In the present embodiment, a stacked component section 12 is constituted by a reactor 3 and the pair of cooling tubes 4 sandwiching the reactor 3 from both sides in the stacking direction X.

Then, a supporting portion 7 is sandwiched between a cooling tube 4 at a rear end of the stacked component section 12 and a cooling tube 4 at a front end of a stacked semiconductor section 11.

Other configurations are the same as those in the first embodiment.

In the present embodiment, it can be a structure of sandwiching the reactor 3 by the cooling tubes 4 from both sides in the stacking direction X.

Therefore, it is possible to improve the cooling efficiency of the reactor 3.

Apart from that, it has the same functions and effects as the first embodiment.

Fourth Embodiment

As shown in FIG. 10 to FIG. 13, the present embodiment is an embodiment that has load withstanding portions 74 formed unitarily in a case 5 and a supporting plate 73 which is a component separated from the case 5 as a supporting portion 7.

The supporting plate 73 is interposed between the load withstanding portions 74 and a stacked semiconductor section 11.

In the present embodiment, the supporting plate 73 and the load withstanding portions 74 of the supporting portion 7 are disposed at positions respectively corresponding to positions of the main plate portion 71 and the vertical plate portions 72 of the supporting portion 7 in the second embodiment (refer to FIGS. 6 to 8).

Figure 13:
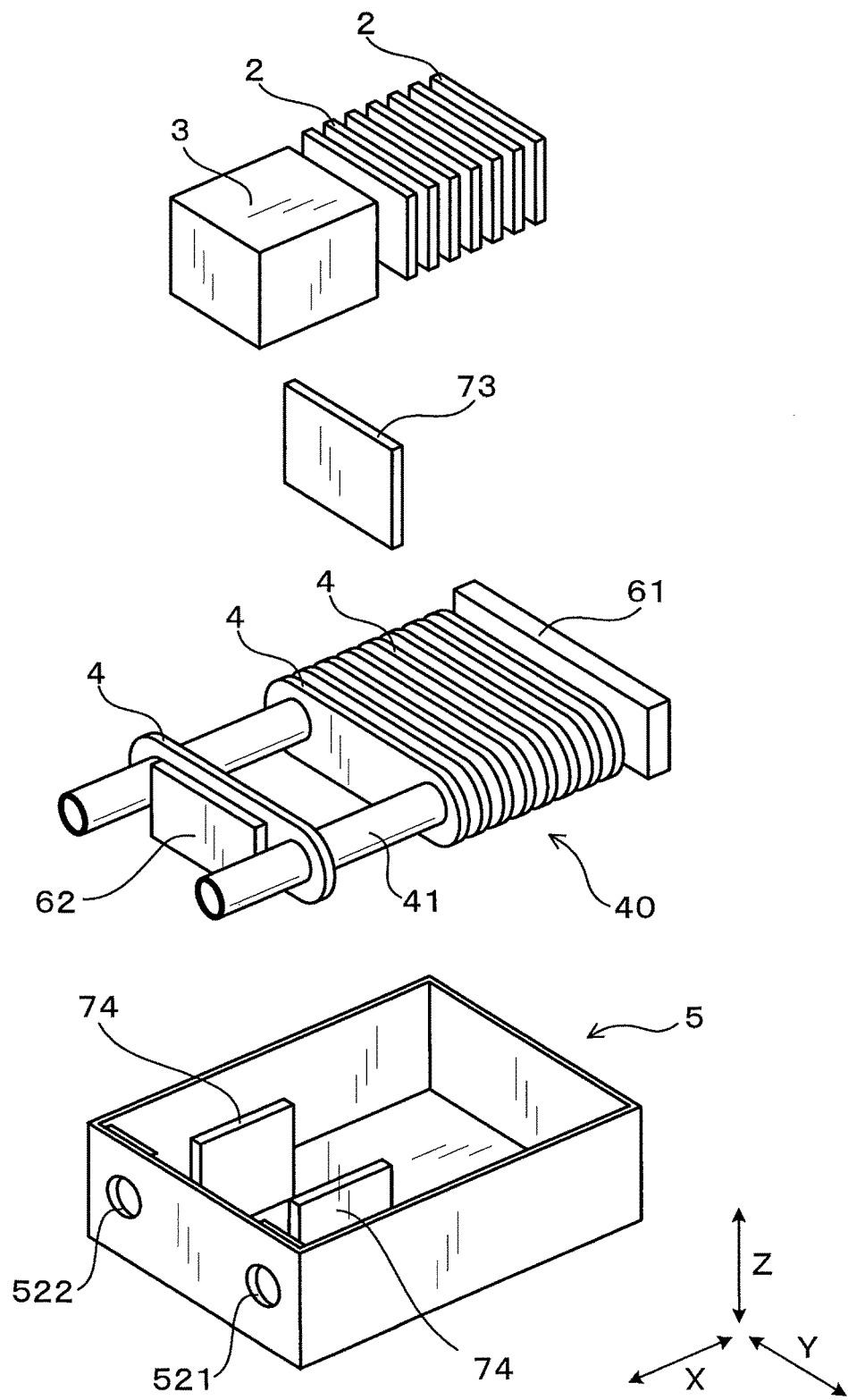
FIG. 13 shows an exploded perspective view of the electric power converter according to the fourth embodiment.

As shown in FIG. 13, a difference in configuration of the second embodiment and the present embodiment is in a point that the supporting plate 73 is the component separated from the case 5.

Figure 12:
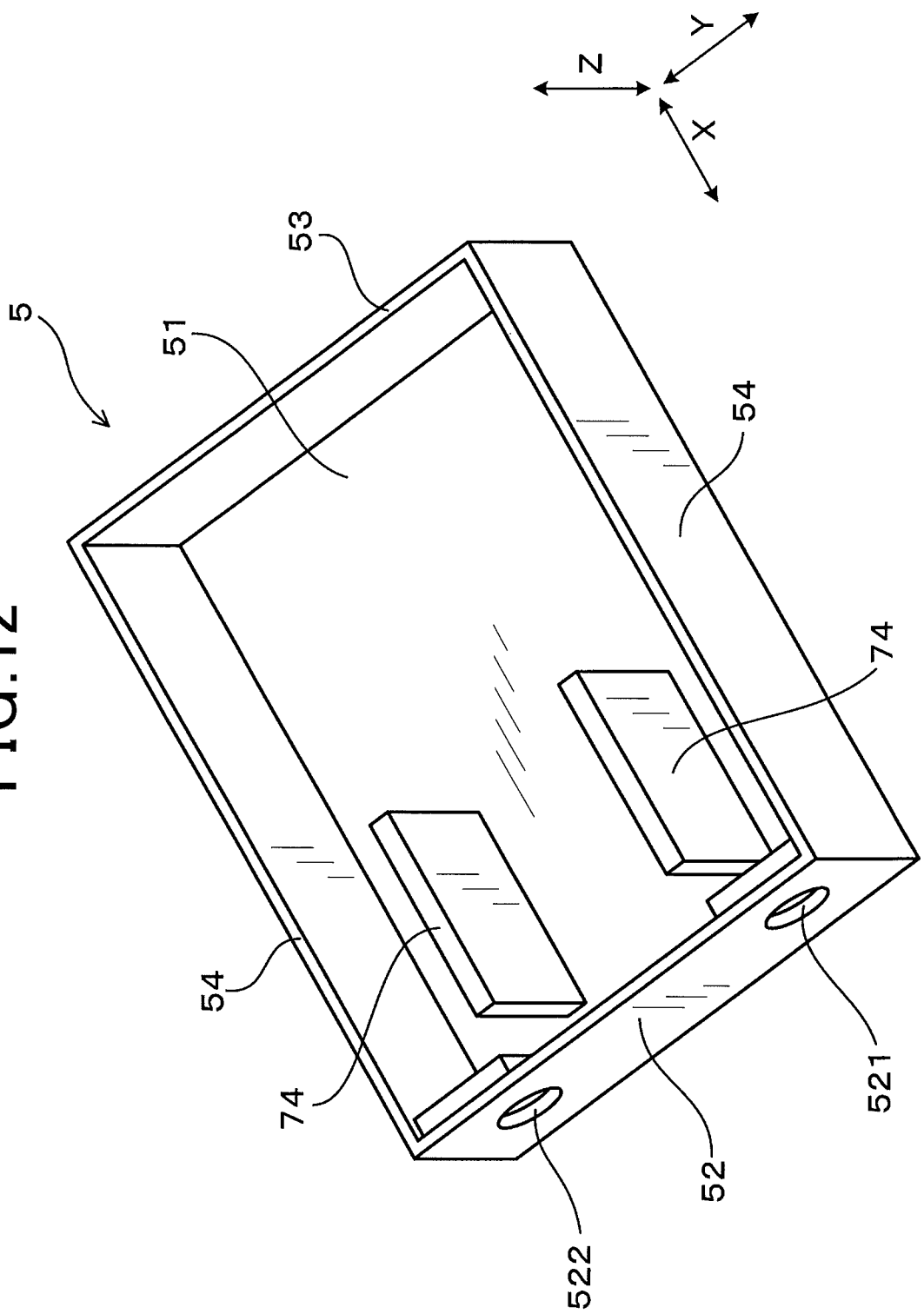
FIG. 12 shows a perspective view of a case according to the fourth embodiment.

As shown in FIG. 12, the load withstanding portions 74 are disposed upwardly from a bottom plate portion 51 of the case 5.

That is, the pair of plate-shaped load withstanding portions 74 are disposed upwardly parallel to each other from the bottom plate portion 51.

The pair of load withstanding portions 74 are disposed so that a normal direction thereof is the lateral direction Y.

The supporting plate 73 is made of a plate-shaped body of rigid metal plate or the like.

Further, the supporting plate 73 is made of a metal member having a high thermal conductivity such as copper.

Figure 10:
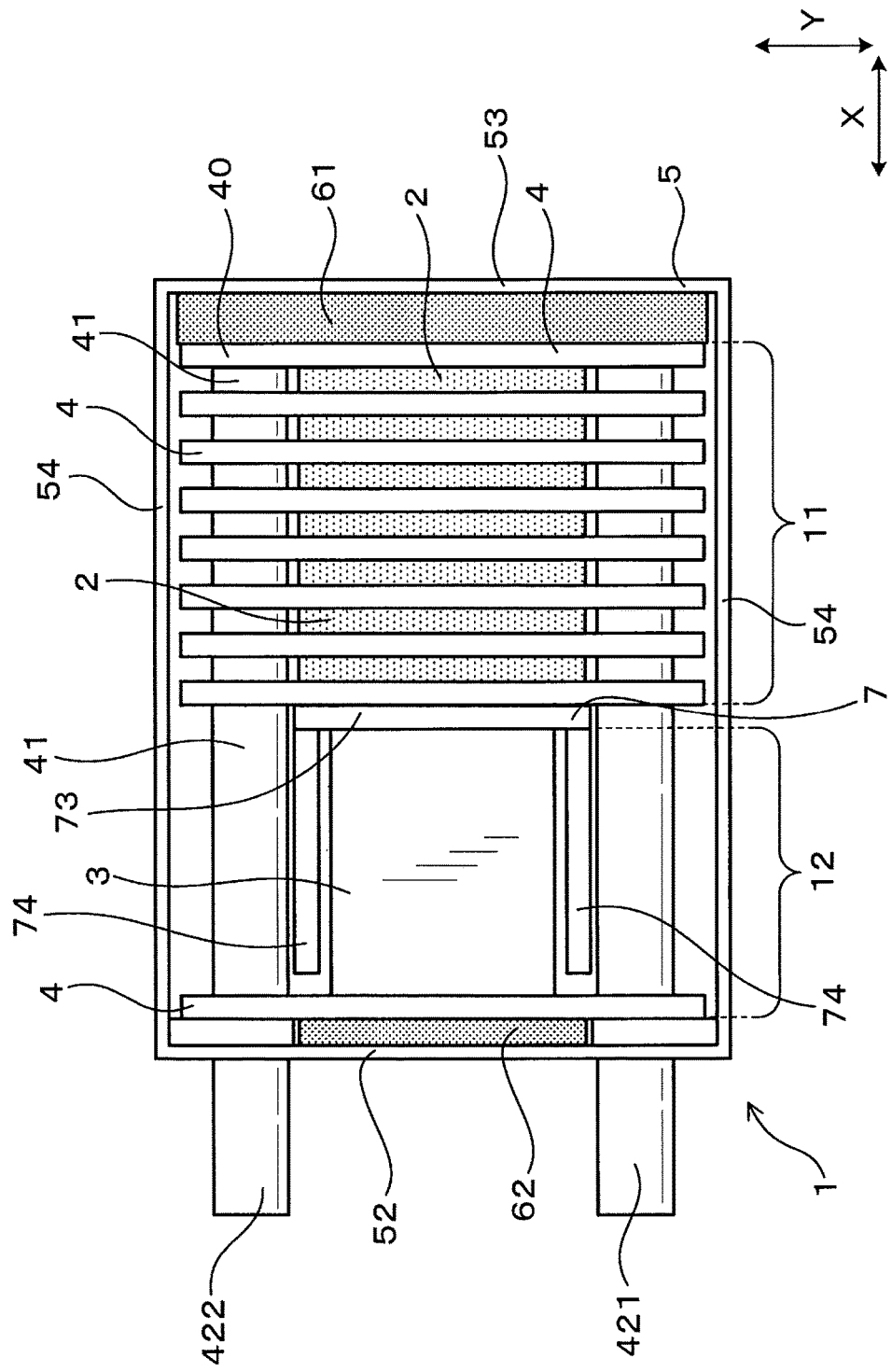
FIG. 10 shows a plan view of an electric power converter according to a fourth embodiment.
Figure 11:
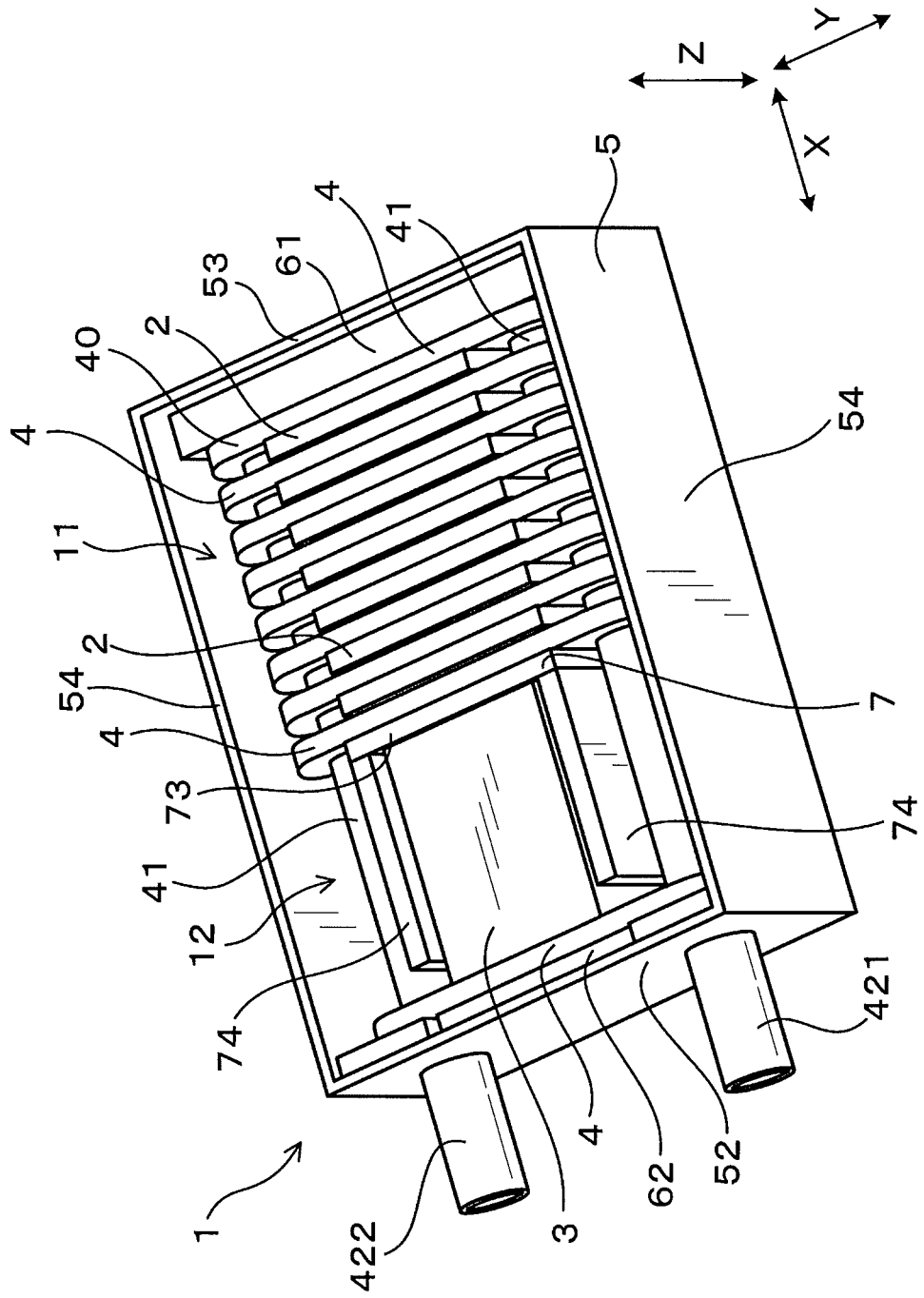
FIG. 11 shows a perspective view of the electric power converter according to the fourth embodiment.

Then, as shown in FIGS. 10 and 11, both end portions in the lateral direction Y of the supporting plate 73 are in contact with rear ends of the pair of load withstanding portions 74.

Thereby, the supporting plate 73 is to be supported by the load withstanding portions 74 from the front.

Therefore, it is configured that the pressing force of a main pressure member 61 acting on the stacked semiconductor section 11 is supported by the supporting portion 7, and is not acting on the stacked component section 12.

Further, in the present embodiment, a sub-pressure member 62 is configured so as to act on the stacked component section 12 from the front.

The pressing force of the sub-pressure member 62 acting on the stacked component section 12 is also acting on the stacked semiconductor section 11 via the supporting plate 7.

That is, in addition to the pressing force of the main pressure member 61, the pressing force of the sub-pressure member 62 is also acting on the stacked semiconductor section 11. This point is different from the second embodiment.

Other configurations are the same as those in the first embodiment.

In the present embodiment, it becomes easy to configure the supporting plate 73 by a different material from the case 5.

Therefore, by forming the supporting plate 73 by a material having high thermal conductivity than the case 5, for example, the cooling efficiency of the reactor 3 can be improved.

More specifically, the case 5 may be constituted by aluminum, and the supporting plate 73 may be constituted by copper, for example.

In this case, while ensuring weight reduction and durability of the case 5, it is possible to improve the heat dissipation of the reactor 3.

Apart from that, it has the same functions and effects as the first embodiment.

Fifth Embodiment

The present embodiment is a modification of the fourth embodiment, and as shown in FIG. 14 to FIG. 17, shapes, arrangements, and the like of load withstanding portions 74 and a supporting plate 73 that constitute a supporting portion 7 are changed.

Figure 14:
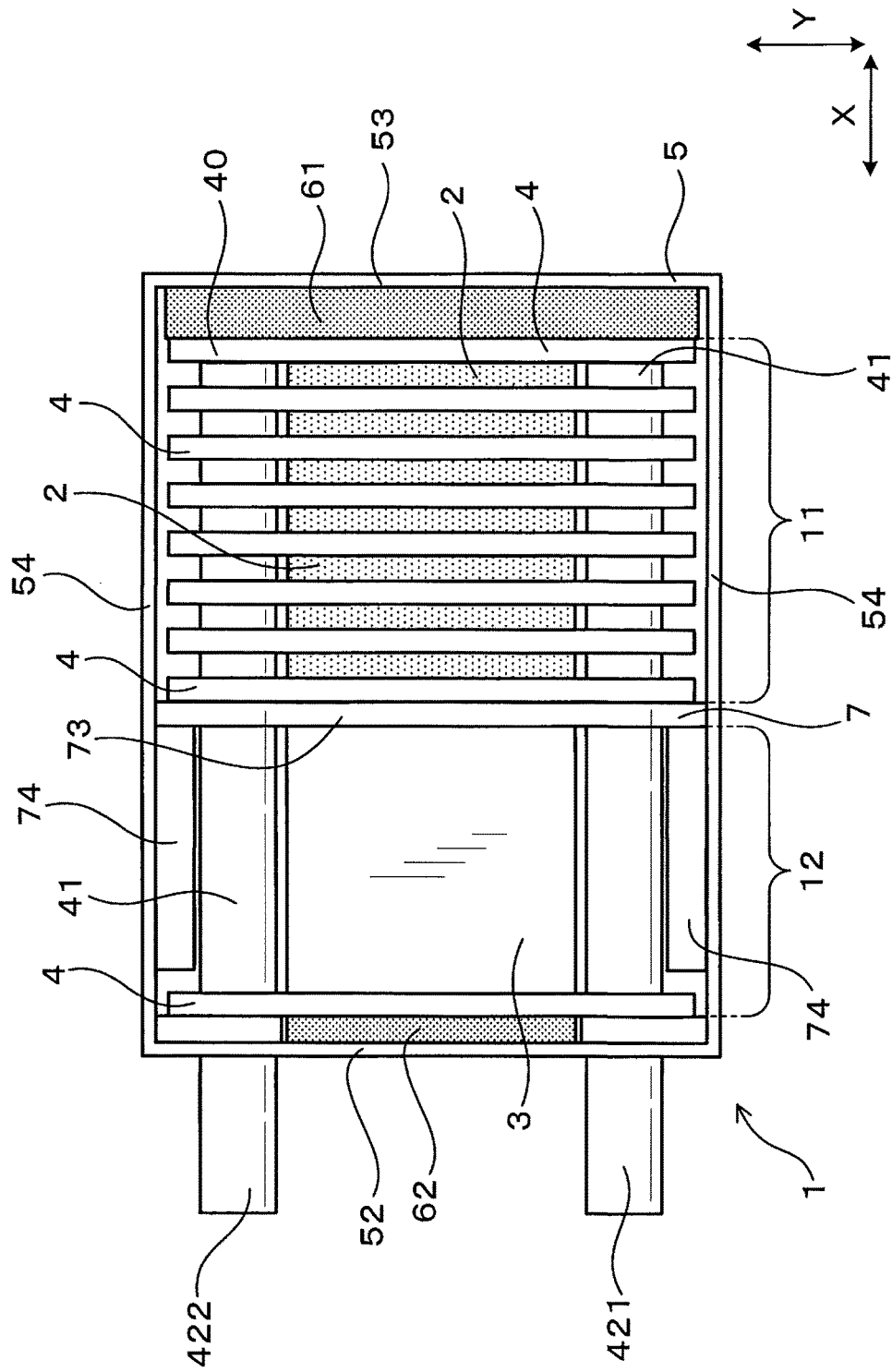
FIG. 14 shows a plan view of an electric power converter according to a fifth embodiment.
Figure 15:
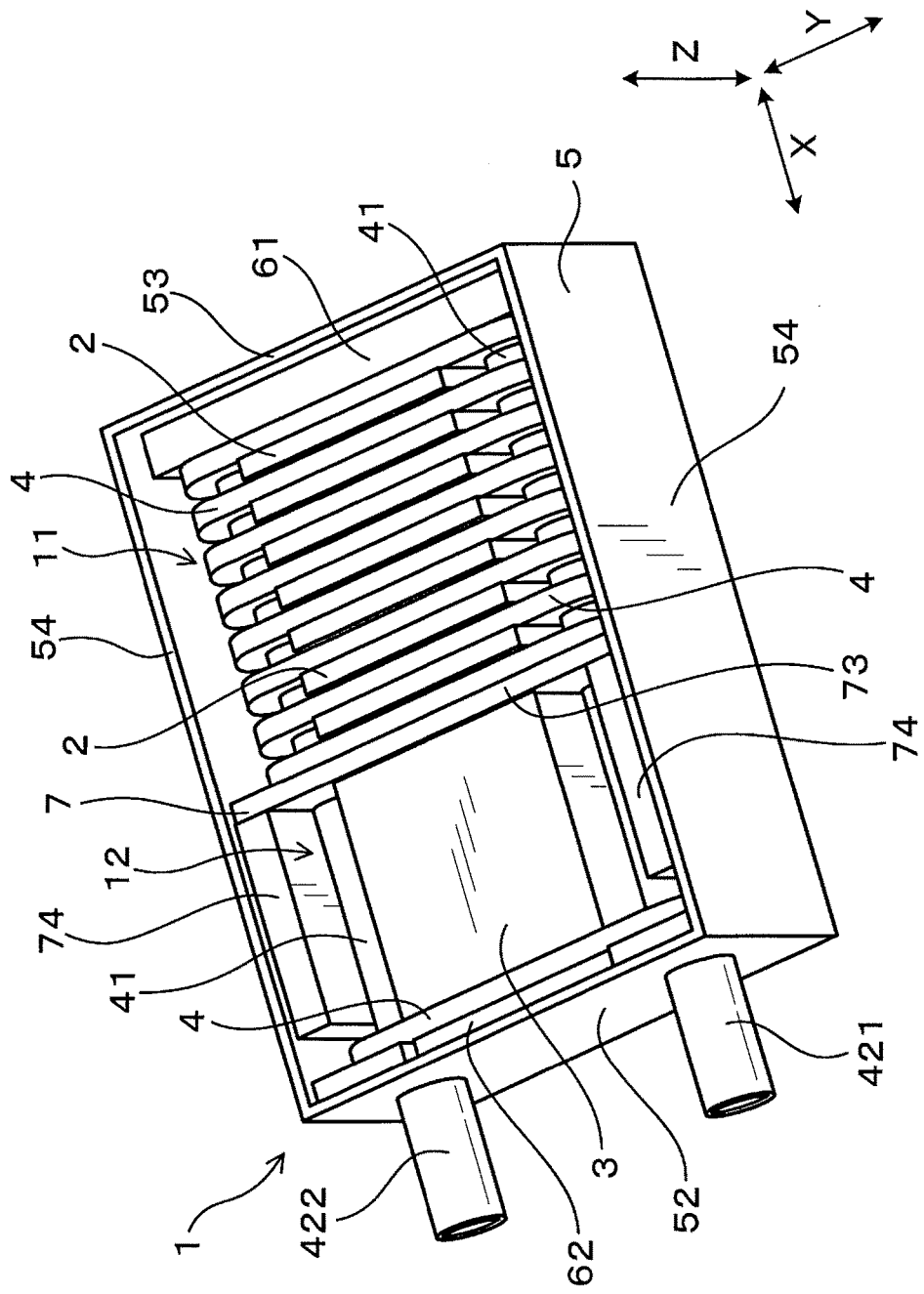
FIG. 15 shows a perspective view of the electric power converter according to the fifth embodiment.

That is, in the present embodiment, as shown in FIG. 14 and FIG. 15, the length of the supporting plate 73 in the lateral direction Y is increased to outsides of a pair of connecting tubes 41 disposed in the lateral direction Y in a cooler 40.

Figure 17:
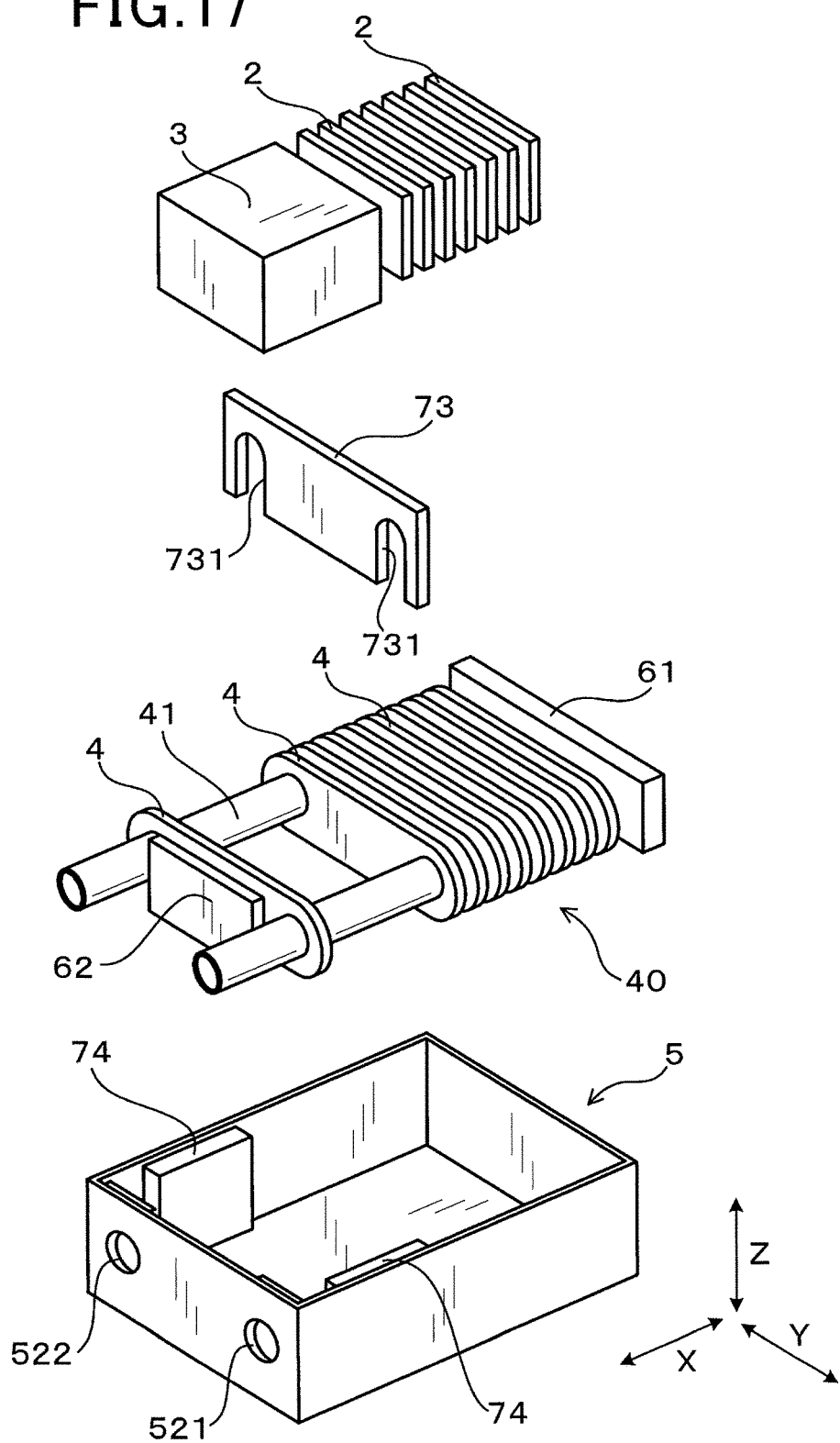
FIG. 17 shows an exploded perspective view of the electric power converter according to the fifth embodiment.

Then, as shown in FIG. 17, a pair of cutout portions 731 are formed in the supporting plate 73 in order to avoid interference between the connecting tubes 41.

Each cutout portion 731 has a shape opening downwardly in the supporting plate 73.

Figure 16:
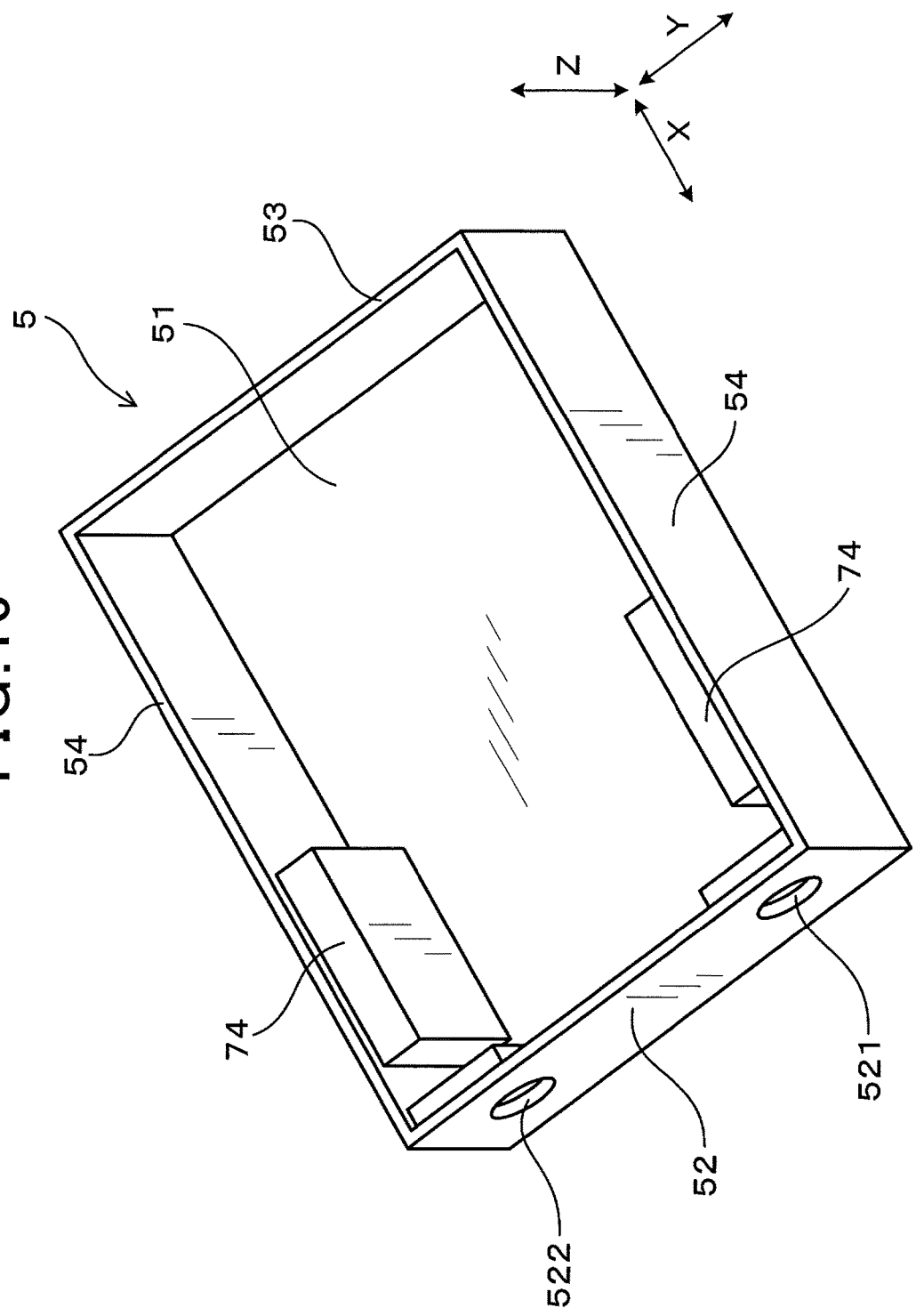
FIG. 16 shows a perspective view of a case according to the fifth embodiment.

As shown in FIG. 16, the load withstanding portions 74 are formed along side wall portions 54 of the case 5.

That is, as shown in FIG. 14, the pair of load withstanding portions 74 are disposed outside the connecting tubes 41 that are disposed adjacent in the lateral direction Y to the reactor 3.

The load withstanding portions 74 are unitarily formed with a bottom plate portion 51 and the side wall portions 54.

Then, both end portions in the lateral direction Y of the supporting plate 73 are disposed within the case 5 in a state of being in contact with rear ends of the load withstanding portions 74.

In this state, the connecting tube 41 is disposed to each of the pair of cutout portions 731.

Other configurations are the same as those in the fourth embodiment.

In the present embodiment, since it is possible to increase the length of the supporting plate 73 in the lateral direction Y, a cooling tube 4 at the front end of the stacked semiconductor section 11 can be supported by a wider area.

Further, by disposing the load withstanding portions 74 in spaces between the connecting tubes 41 disposed in the lateral direction Y of the reactor 3 and the side wall portions 54 of and the case 5, it becomes easy to achieve a space saving.

Apart from that, it has the same functions and effects as the fourth embodiment.

It should be noted that, although not shown, as a variation to the fifth embodiment described above, fitting recesses such as grooves for fitting edges of the supporting plate 73 may be disposed in inner surface of the case 5, for example, instead of disposing load withstanding portions 74.

In this case, by disposing the supporting plate 73 in a state where the edges of the supporting plate 73 being fitted into the fitting recesses, the supporting plate 73 can receive a pressing force from the stacked semiconductor section 11.

The fitting recesses are preferably disposed on the inner surfaces of the side wall portions 54 of the case 5.

Further, the fitting recesses are preferably disposed on the inner surfaces of the side wall portions 54 and on an upper surface of the bottom plate portion 51.

In addition, by applying such a variation to the third embodiment, the supporting plate 73 which is a component separated from the case 5 may be configured to dispose between the pair of cooling tubes 4.

Sixth Embodiment

Figure 18:
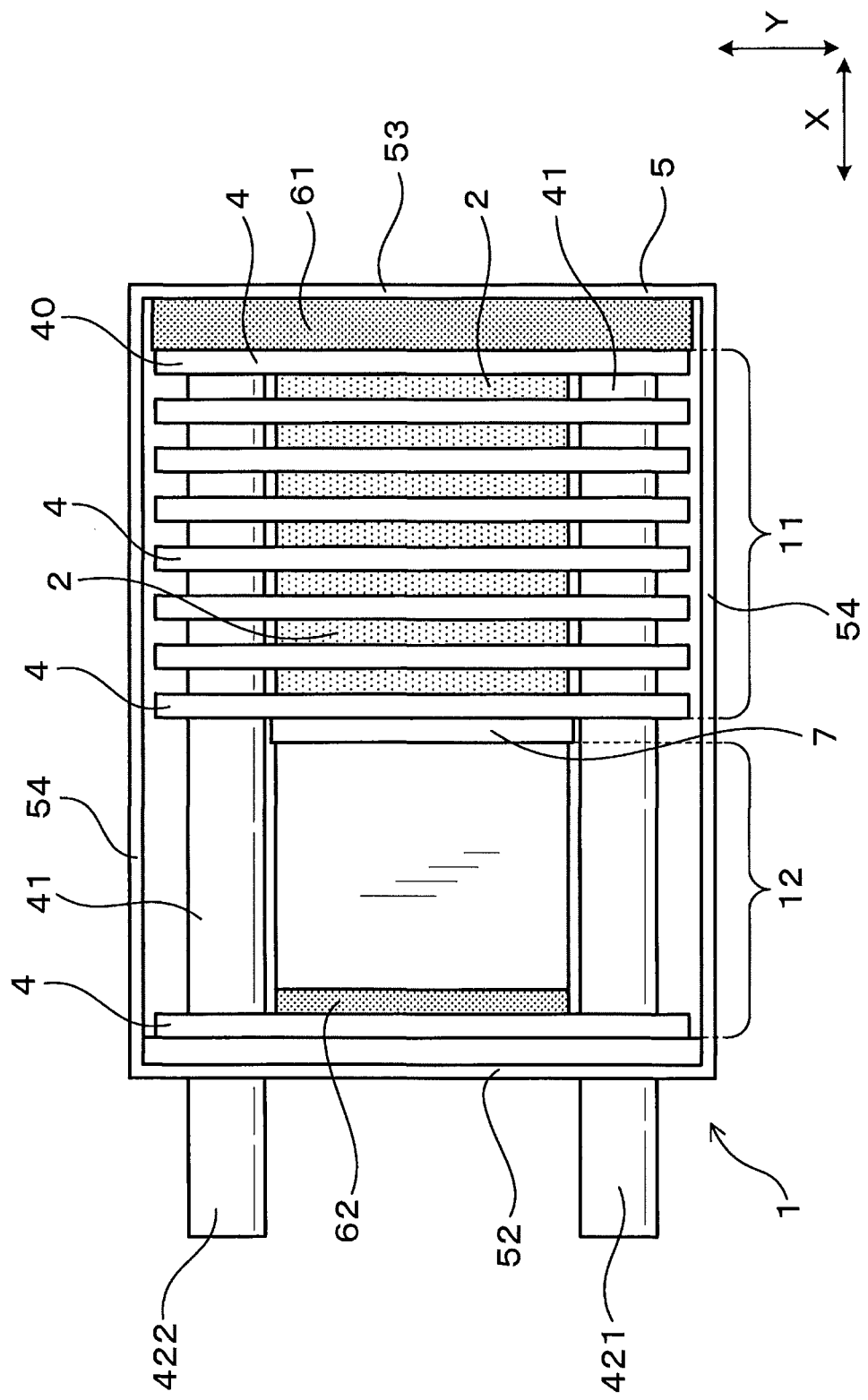
FIG. 18 shows a plan view of an electric power converter according to a sixth embodiment.

As shown in FIG. 18, the present embodiment is an embodiment of an electric power converter 1 of which a sub-pressure member 62 is disposed between a cooling tube 4 and a reactor 3.

In the present embodiment, the sub-pressure member 62 has a thermal conductivity.

A silicone resin sheet containing heat conductive filler, for example, may be used as the sub-pressure member 62 having thermal conductivity.

The electric power converter 1 of the present embodiment has a configuration in which a stacked component section 12 is pressed outwardly in the stacking direction X from between the reactor 3 and the cooling tube 4 that are stacked to each other.

Thereby, the cooling tube 4 disposed on a front side of the sub-pressure member 62 is pressed against a front wall portion 52, and the reactor 3 disposed on a rear side of the sub-pressure member 62 is pressed against a supporting portion 7.

Then, the sub-pressure member 62 are pressed against the both of the reactor 3 and the cooling tube 4 in a state of being elastically compressed.

Thus, by the sub-pressure member 62 having thermal conductivity is brought into pressure contact with both of the reactor 3 and the cooling tube 4, thermal resistance between the reactor 3 and the cooling tube 4 is made smaller.

Thereby, the reactor 3 is configured to be efficiently cooled by the cooling tubes 4.

Other configurations, functions and effects are the same as those in the first embodiment.

Seventh Embodiment

Figure 19:
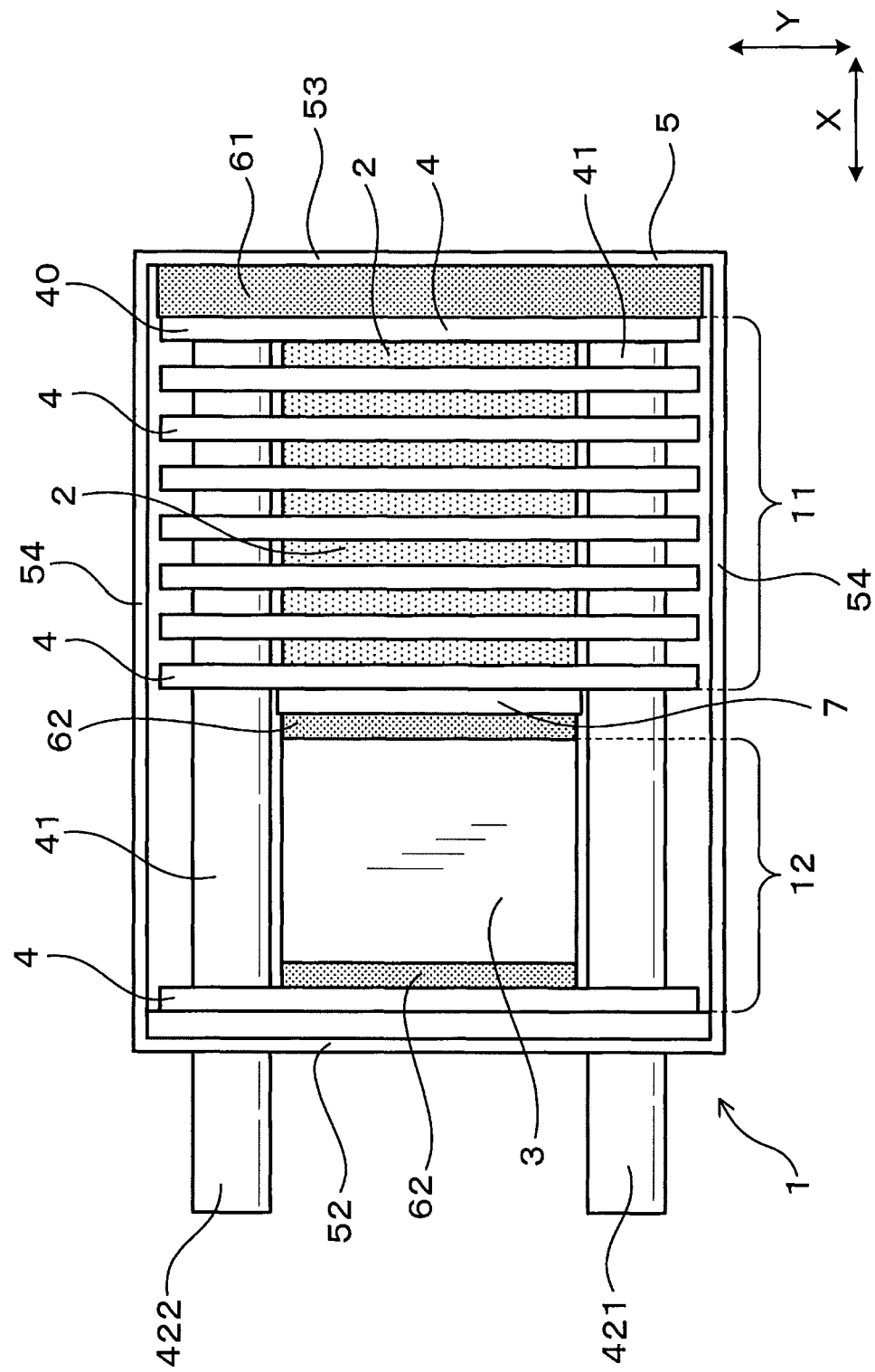
FIG. 19 shows a plan view of an electric power converter according to a seventh embodiment.

As shown in FIG. 19, the present embodiment is an embodiment in which sub-pressure members 62 are disposed on both sides in the stacking direction X of a reactor 3.

That is, the sub-pressure members 62 having thermal conductivity are disposed on front and rear surfaces of the reactor 3.

The sub-pressure member 62 disposed on the rear surface of the reactor 3 is interposed between a supporting portion 7 and the reactor 3.

Other configurations are the same as those in the sixth embodiment.

In addition, even in the present embodiment, it is possible to obtain the same functions and effects as in the sixth embodiment.

Eighth Embodiment

Figure 20:
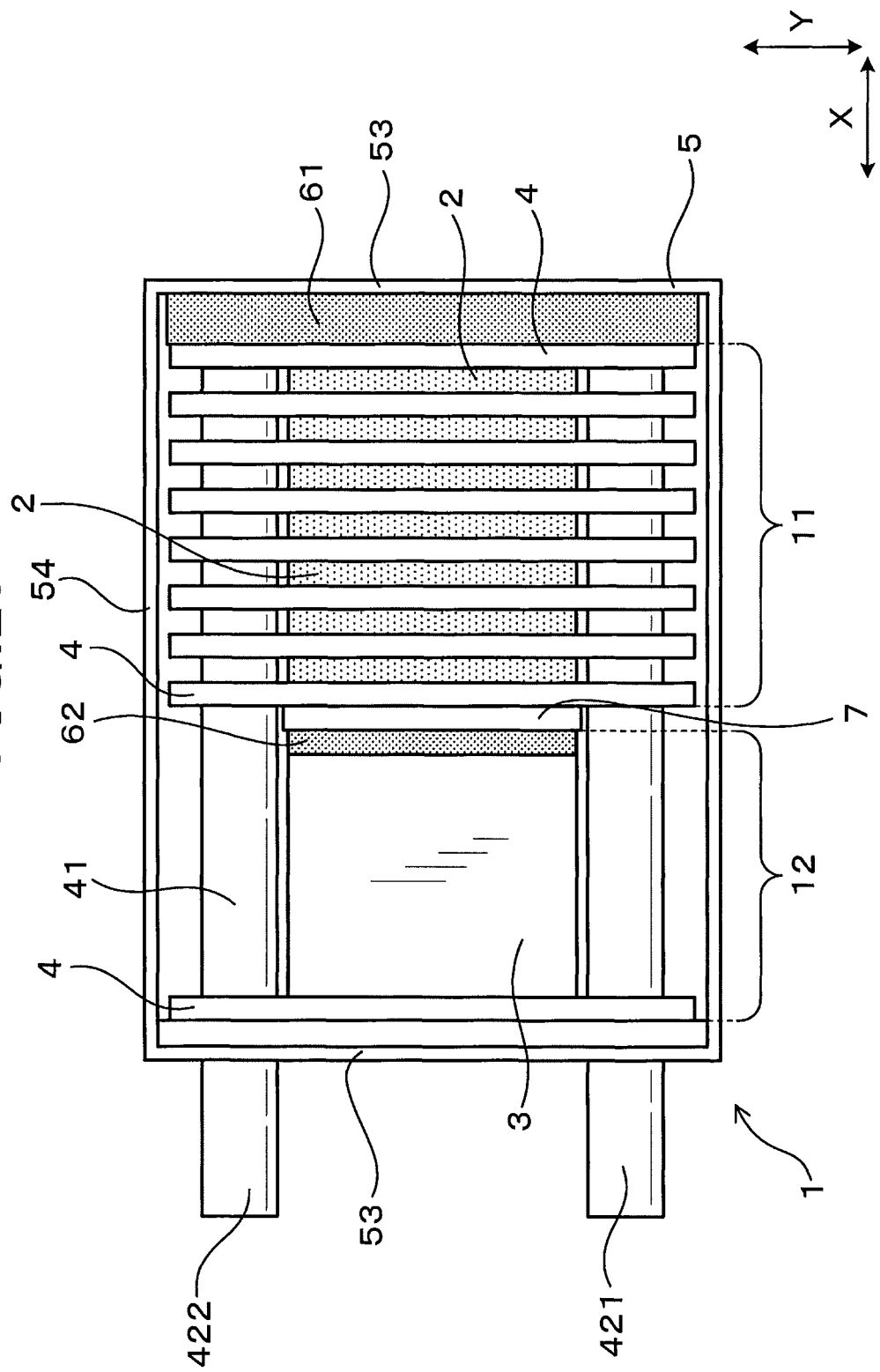
FIG. 20 shows a plan view of an electric power converter according to an eighth embodiment.

As shown in FIG. 20, the present embodiment is an embodiment in which no sub-pressure member 62 is disposed at a front side of a reactor 3, but the sub-pressure member 62 is disposed between a rear surface of the reactor 3 and a supporting portion 7.

That is, in the present embodiment, the sub-pressure member 62 is disposed at an end portion of a stacked component section 12 in a stacked semiconductor section 11 side.

More specifically, the sub-pressure member 62 is interposed between the stacked component section 12 and the supporting portion 7.

Other configurations are the same as those in the first embodiment.

In the present embodiment, by pressing the stacked component section 12 forwardly, it is possible to obtain a contact pressure between the reactor 3 and a cooling tube 4.

Apart from that, it has the same functions and effects as the first embodiment.

Ninth Embodiment

Figure 21:
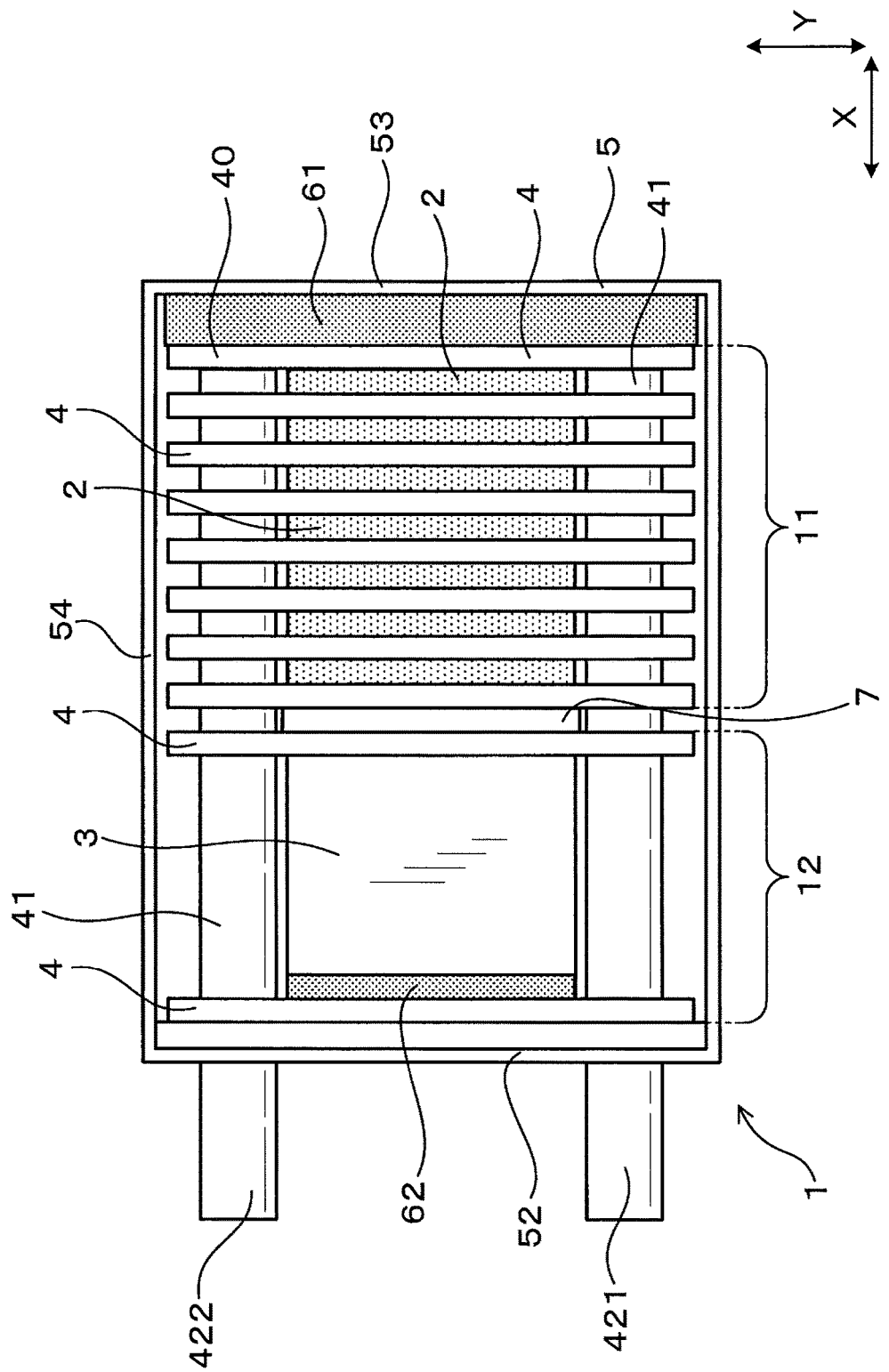
FIG. 21 shows a plan view of an electric power converter according to a ninth embodiment.
Figure 22:
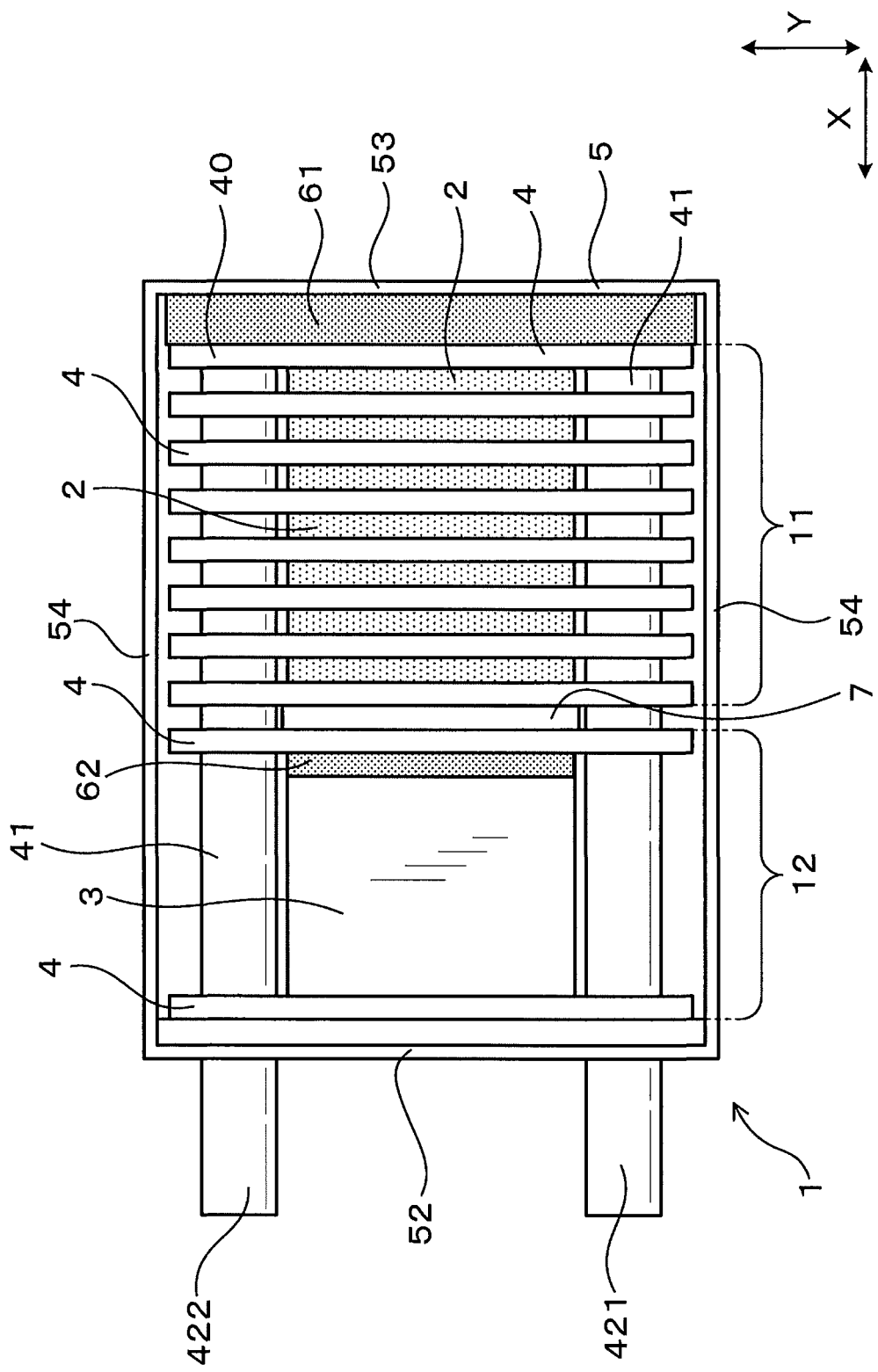
FIG. 22 shows a plan view of a modified electric power converter according to the ninth embodiment.

As shown in FIG. 21 and FIG. 22, the present embodiment is an embodiment in which a sub-pressure member 62 is disposed between a cooling tube 4 and a reactor 3 in a configuration in which a support portion 7 is interposed between a pair of cooling tubes 4.

That is, as in the third embodiment (refer to FIG. 9), a stacked component section 12 is constituted by the reactor three and the pair of cooling tubes 4 that sandwich the reactor 3 from both sides in the stacking direction X.

Then, the sub-pressure member 62 is interposed between the cooling tube 4 at a front end and a front surface of the reactor 3 in the electric power converter 1 shown in FIG. 21.

Further, the sub-pressure member 62 is interposed between a rear surface of the reactor 3 and the cooling tube 4 in the electric power converter 1 shown in FIG. 22.

It should be noted that, although not shown, in both the front and rear surfaces of the reactor 3, the sub-pressure members 62 may be configured to be sandwiched between the reactor 3 and the cooling tubes 4.

Other configurations are the same as those in the third or sixth embodiment.

In the present embodiment, it is possible to obtain advantageous effects by combining the effects of the third embodiment and the effects of the sixth embodiment.

Tenth Embodiment

Figure 23:
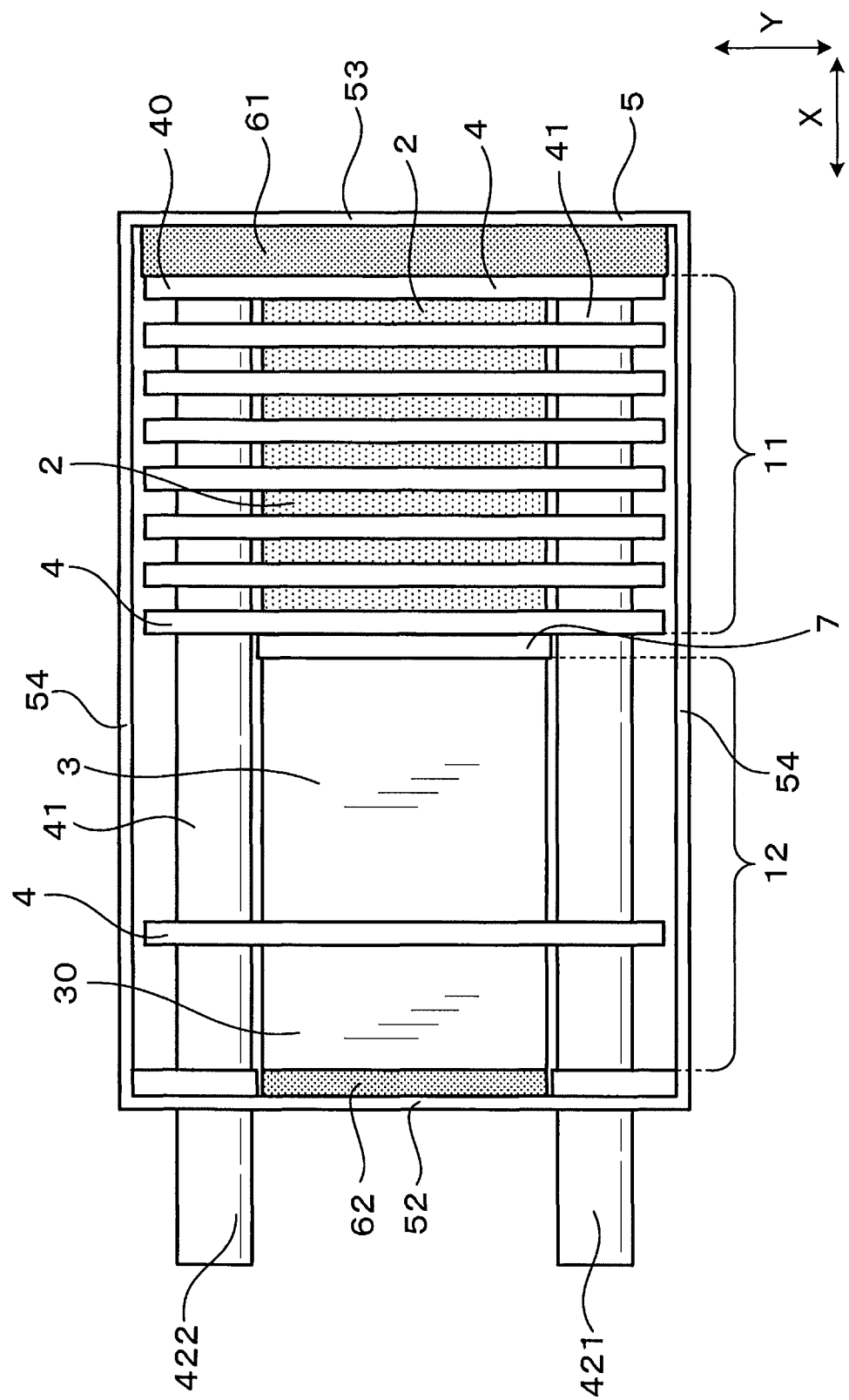
FIG. 23 shows a plan view of an electric power converter according to a tenth embodiment.
Figure 24:
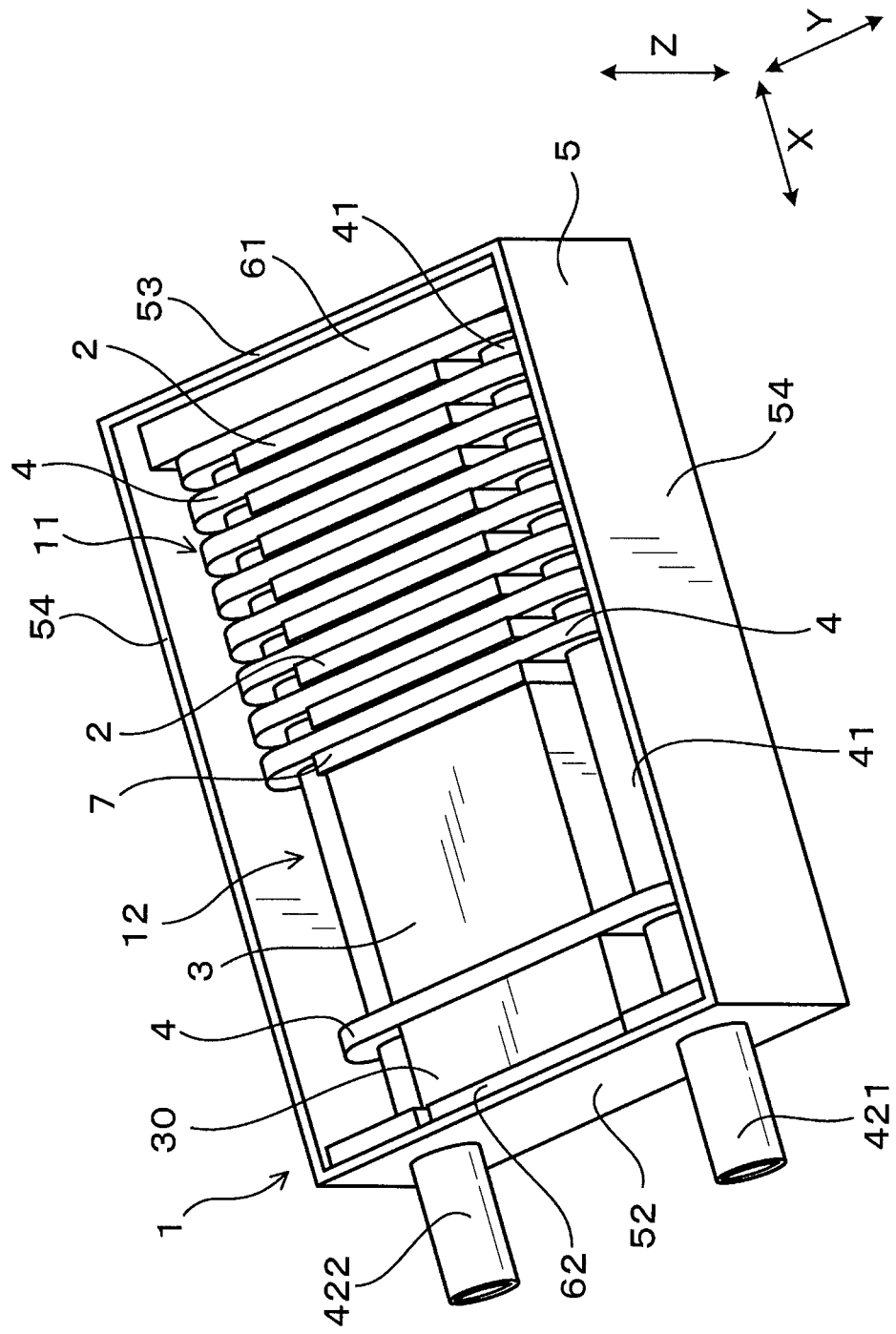
FIG. 24 shows a perspective view of the electric power converter according to the tenth embodiment.

As shown in FIG. 23 to FIG. 25, the present embodiment is an embodiment of an electric power converter 1 in which a stacked component section 11 is formed by stacking a plurality of types of electronic components together with cooling tubes 4.

The cooling tube 4 is interposed between the plurality of types of electronic components adjacent in the stacking direction X.

In the present embodiment, the plurality of electronic components in the stacked component section 12 are a reactor 3 and a DC-DC converter 30.

That is, in the present embodiment, the stacked component section 12 is formed by stacking the DC-DC converter 30 in addition to the reactor 3 together with the cooling tubes 4.

As shown in FIG. 23 and FIG. 24, the stacked component section 12 includes the DC-DC converter 30 disposed in a front side, the reactor 3 disposed in a rear side, and the cooling tube 4 disposed therebetween.

Then, a rear surface of the reactor 3 is in contact with a supporting portion 7.

Further, a sub-pressure member 62 is press-contacted on a front surface of the DC-DC converter 30.

Then, the sub-pressure member 62 is interposed between the DC-DC converter 30 and a front wall portion 52 of the case 5 in a state of being elastically compressed in the stacking direction X.

Thus, the sub-pressure member 62 presses the stacked component section 12 toward the supporting portion 7.

As a result, the stacked component section 12 is pressed so as to be compressed in the stacking direction X.

Then, the DC-DC converter 30 and the reactor 3 are to be pressed respectively against front and rear surfaces of the cooling tube 4 disposed therebetween.

Further, as in the first embodiment, a stacked semiconductor section 11 and a main pressure member 61 are disposed at a rear of the supporting portion 7.

Thereby, a pressing force of the main pressure member 61 is prevented from acting on the stacked component section 12.

Other configurations are the same as those in the first embodiment.

In the present embodiment, both the reactor 3 and the DC-DC converter 30 can be efficiently cooled by the cooling tubes 4.

Then, it is possible to prevent the pressing force of the main pressure member 61 from acting on the reactor 3 and the DC-DC converter 30.

Apart from that, it has the same functions and effects as the first embodiment.

The present disclosure is not limited to the above embodiments, but may be applied to various embodiments without departing from the scope of the present disclosure.

It is also possible to appropriately combine the plurality of embodiments described above for an embodiment.

Further, as an electronic component in the stacked component section, in addition to the reactor or the DC-DC converter, a capacitor, a resin sealed circuit board, or the like may be used.

Incidentally, if an electronic apparatus such as a DC-DC converter composed of a plurality of components is incorporated as a constitutional unit of the electric power converter, it is interpreted as a single electronic component.

What is claimed is:

1. An electric power converter comprising:
   a semiconductor module with a built-in switching element;
   an electronic component electrically connected to the semiconductor module;
   a plurality of cooling tubes for cooling the semiconductor module and the electronic component by sandwiching them from both sides;
   a case for accommodating the semiconductor module, the electronic component, and the cooling tubes;
   a main pressure member for pressing a stacked semiconductor section formed by stacking the semiconductor module and the cooling tubes in a stacking direction; and
   a sub-pressure member for pressing a stacked component section formed by stacking the electronic component and the cooling tubes in the stacking direction; wherein,
   the stacked semiconductor section and the stacked component section are stacked in line;
   a pressing force of the main pressure member is greater than a pressing force of the sub-pressure member;
   the main pressure member is disposed at an end portion of the stacked semiconductor section far from the stacked component section; and
   a supporting portion that supports the stacked semiconductor section from the stacked component section side is disposed in the case so as to prevent the pressing force of the main pressure member from acting on the stacked component section.

2. The electric power converter according to claim 1, wherein,
   the supporting portion is formed unitarily with the case.

3. The electric power converter according to claim 1, wherein,
   the supporting portion includes a load withstanding portion formed unitarily in the case and a supporting plate which is a component separated from the case; and
   the supporting plate is interposed between the load withstanding portion and the stacked semiconductor section.

4. The electric power converter according to claim 1, wherein,
   the supporting portion is interposed between the electronic component and the cooling tubes.

5. The electric power converter according to claim 1, wherein,
   the supporting portion is interposed between a pair of the cooling tubes.

6. The electric power converter according to claim 1, wherein,
   the sub-pressure member is disposed on a surface of the cooling tube opposite to the electronic component side.

7. The electric power converter according to claim 1, wherein,
   the sub-pressure member having a thermal conductivity is disposed between the cooling tubes and the electronic component.

8. The electric power converter according to claim 1, wherein,
   the sub-pressure member is disposed at an end portion of the stacked component section far from the stacked semiconductor section.

9. The electric power converter according to claim 1, wherein,
   the sub-pressure member is disposed at an end portion of the stacked component section in the stacked semiconductor section side.

10. The electric power converter according to claim 1, wherein,
    the stacked component section is formed by stacking a plurality of types of the electronic components together with the cooling tubes; and
    the cooling tube is interposed between the plurality of types of electronic components adjacent in the stacking direction.

* * * * *